(12) United States Patent
Son et al.

(10) Patent No.: US 9,087,614 B2
(45) Date of Patent: Jul. 21, 2015

(54) MEMORY MODULES AND MEMORY SYSTEMS

(71) Applicant: Samsung Electronics Co., Ltd., Suwon-Si, Gyeonggi-Do (KR)

(72) Inventors: Jong-Pil Son, Seongnam-si (KR); Uk-Song Kang, Seongnam-si (KR); Chul-Woo Park, Yongin-si (KR); Young-Soo Sohn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/087,167

(22) Filed: Nov. 22, 2013

(65) Prior Publication Data

US 2014/0146624 A1    May 29, 2014

Related U.S. Application Data

(60) Provisional application No. 61/730,143, filed on Nov. 27, 2012.

(30) Foreign Application Priority Data

Mar. 11, 2013 (KR) .................. 10-2013-0025385

(51) Int. Cl.
| | |
|---|---|
| G11C 7/12 | (2006.01) |
| G11C 29/44 | (2006.01) |
| G06F 11/10 | (2006.01) |
| G11C 29/00 | (2006.01) |
| G11C 5/04 | (2006.01) |
| G11C 29/04 | (2006.01) |

(52) U.S. Cl.
CPC ........ *G11C 29/4401* (2013.01); *G06F 11/1048* (2013.01); *G11C 29/808* (2013.01); *G11C 5/04* (2013.01); *G11C 2029/0409* (2013.01); *G11C 2029/0411* (2013.01)

(58) Field of Classification Search
CPC ............................... G11C 7/12; G11C 29/785
USPC ............................................. 365/200, 189.05
See application file for complete search history.

(56) References Cited

U.S. PATENT DOCUMENTS

| | | |
|---|---|---|
| 8,060,774 B2 | 11/2011 | Smith et al. |
| 2005/0071543 A1 | 3/2005 | Ellis et al. |
| 2007/0255999 A1 | 11/2007 | Risse |
| 2008/0010435 A1* | 1/2008 | Smith et al. ..................... 712/10 |
| 2012/0099389 A1 | 4/2012 | Park et al. |
| 2014/0325315 A1* | 10/2014 | Warnes et al. ................ 714/767 |

FOREIGN PATENT DOCUMENTS

| | | |
|---|---|---|
| JP | 2012-128660 A | 7/2012 |
| KR | 2012-0040974 A | 4/2012 |

* cited by examiner

*Primary Examiner* — Michael Tran
(74) *Attorney, Agent, or Firm* — Harness, Dickey & Pierce

(57) ABSTRACT

In one example embodiment, a memory module includes a plurality of memory devices and a buffer chip configured to manage the plurality of memory device. The buffer chip includes a memory management unit having an error correction unit configured to perform error correction operation on each of the plurality of memory devices. Each of the plurality of memory devices includes at least one spare column that is accessible by the memory management unit, and the memory management unit is configured to correct errors of the plurality of memory devices by selectively using the at least one spare column based on an error correction capability of the error correction unit.

18 Claims, 20 Drawing Sheets

MEMORY MODULES AND MEMORY SYSTEMS

CROSS-REFERENCE TO RELATED APPLICATION(S)

This application claims under 35 USC §119 priority to and the benefit of U.S. Provisional Application No. 61/730,143 filed on Nov. 27, 2012, in the U.S. Patent and Trademarks Office (USPTO) and Korean Patent Application No. 10-2013-0025385, filed on Mar. 11, 2013, in the Korean Intellectual Property Office (KIPO), the entire contents of which are incorporated by references herein.

BACKGROUND

1. Technical Field

Some example embodiments relate to memory devices, and more particularly to a memory module and a memory system including the same.

2. Discussion of the Related Art

Semiconductor devices widely used in high-performance electronic systems have experienced improvements in both capacity and speed. A dynamic random access memory (DRAM) is a volatile memory which stores data corresponding to charge in capacitors. The charge stored in the capacitor may leak such that the data therein may be retained for an only limited time before degradation occurs to the point where the state of the data may be unreliable.

SUMMARY

Some example embodiments provide a memory module, capable of enhancing performance while reducing occupied area.

Some example embodiments provide a memory system including the memory module.

In one example embodiment, a memory module includes a plurality of memory devices and a buffer chip configured to manage the plurality of memory device. The buffer chip includes a memory management unit having an error correction unit configured to perform error correction operation on each of the plurality of memory devices. Each of the plurality of memory devices includes at least one spare column that is accessible by the memory management unit, and the memory management unit is configured to correct errors of the plurality of memory devices by selectively using the at least one spare column based on an error correction capability of the error correction unit.

In yet another example embodiment, the memory management unit further includes a first fail address table configured to store fail address information corresponding to an address of at least one memory cell row of the plurality of memory devices, the at least one memory cell row including at least one defective cell.

In yet another example embodiment, the memory management unit further includes a fail address processing unit configured to active a spare column address signal that replace a column corresponding to an access address with the at least one spare column, when the access address matches the address, the fail information of which is stored in the first fail address table.

In yet another example embodiment, the fail address processing unit includes the first fail address table and an address comparing unit configured to compare the access address with the fail addresses and selectively activate the spare column address signal based one the comparing of the access address with the fail address information.

In yet another example embodiment, the memory management unit corrects an error by enabling the at least one spare column when at least one of the plurality of memory devices has an error that occurs at a first memory cell row, the first memory cell row being different from a second memory cell row associated with the fail address information.

In yet another example embodiment, the memory management unit corrects a first error by enabling the at least one spare column and the error correction unit corrects at least one second error without correcting the first error when at least one of the plurality of memory devices has errors including the first error and the at least one second error, the at least one second error being non-correctible by the memory management unit.

In yet another example embodiment, the memory management unit further includes a scrubber configured to perform built-in self test (BIST) on each of the plurality of memory devices, and the fail address information is transmitted from the scrubber to the first fail address table.

In yet another example embodiment, each of the plurality of memory devices includes a second fail address table that stores self fail address information.

In yet another example embodiment, the self fail address information is transmitted from the second fail address table to the first fail address table and is stored as the fail address information.

In yet another example embodiment, the self fail address information is transmitted from the second fail address table to the first fail address table through a data pin of each of the plurality of memory devices during at least one of a power-up sequence and a reset period of the memory module.

In yet another example embodiment, the memory management unit includes a row address activation counting unit configured to output an intensively accessed address designating a intensively accessed memory cell row based on access frequency of memory cell rows of each of the plurality of memory devices, the intensively accessed memory cell row being accessed more than a threshold value during a time interval. The memory management unit further includes a refresh scheduler configured to receive the intensively accessed address and configured to preferentially refresh neighboring memory cell rows adjacent to the intensively accessed memory cell row.

In yet another example embodiment, the time interval corresponds to a refresh period of each of the plurality of memory devices.

In yet another example embodiment, the refresh operation on the neighboring memory cell rows is a Row Address Strobe (RAS) only refresh (ROR), and the refresh scheduler performs the ROR by providing the plurality of memory devices with refresh row addresses corresponding to the neighboring memory cell rows.

In one example embodiment, a memory system includes a memory controller and a memory module configured to communicate with the memory controller to perform memory operation. The memory module includes a plurality of memory devices and a buffer chip configured to manage the plurality of memory devices. The buffer chip includes a memory management unit having an error correction unit configured to perform an error correction operation on each of the plurality of memory devices. Each of the plurality of memory devices includes at least one spare column that is accessible by the memory management unit, and the memory management unit corrects errors of the plurality of memory devices by selectively using the at least one spare column based on an error correction capability of the error correction unit.

In yet another example embodiment, the memory management unit further includes a first fail address table configured to store fail address information corresponding to an address of at least one memory cell row of at least one of the plurality of memory devices, the at least one memory cell row including at least one defective cell. The fail address processing unit is configured to active a spare column address signal that replaces a column corresponding to an access address with the at least one spare column, when the access address matches the address, the fail information of which is stored in the first fail address table. Each of the plurality of memory devices includes a second fail address table that stores self fail address information and the self fail address information is transmitted from the second fail address table to the first fail address table and is stored as the fail address information.

In one example embodiment, a memory module includes a plurality of memory devices, each of the plurality of memory devices including at least one spare column and a memory management unit configured to correct errors of the plurality of memory devices by selectively using the at least one spare column.

In yet another example embodiment, the memory management unit is configured to selectively use the at least one spare column based on an error correction capability of the memory management unit.

In yet another example embodiment, the memory module further includes a scrubber unit configured to detect at least one bit error in each of the plurality of memory devices and a fail address unit configured to store fail address information corresponding to one of the plurality of memory devices in which the scrubber unit detects at least one multi-bit error.

In yet another example embodiment, the memory management unit is further configured to selectively use the at least one spare column by activating the corresponding one of at least one spare column based on the fail address information corresponding to an access address for accessing at least one of the plurality of memory devices.

In yet another example embodiment, the memory management unit further includes a row address activation counting unit configured to output at least one intensively accessed address designating at least one intensively accessed memory cell row of at least one of the plurality of memory devices, the at least one intensively accessed memory cell row being accessed more than a threshold number of times during a time interval. The memory management unit further includes a refresh scheduler configured to refresh neighboring memory cell rows adjacent to the at least one intensively accessed memory cell row.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EXAMPLE EMBODIMENTS

Figure 1:
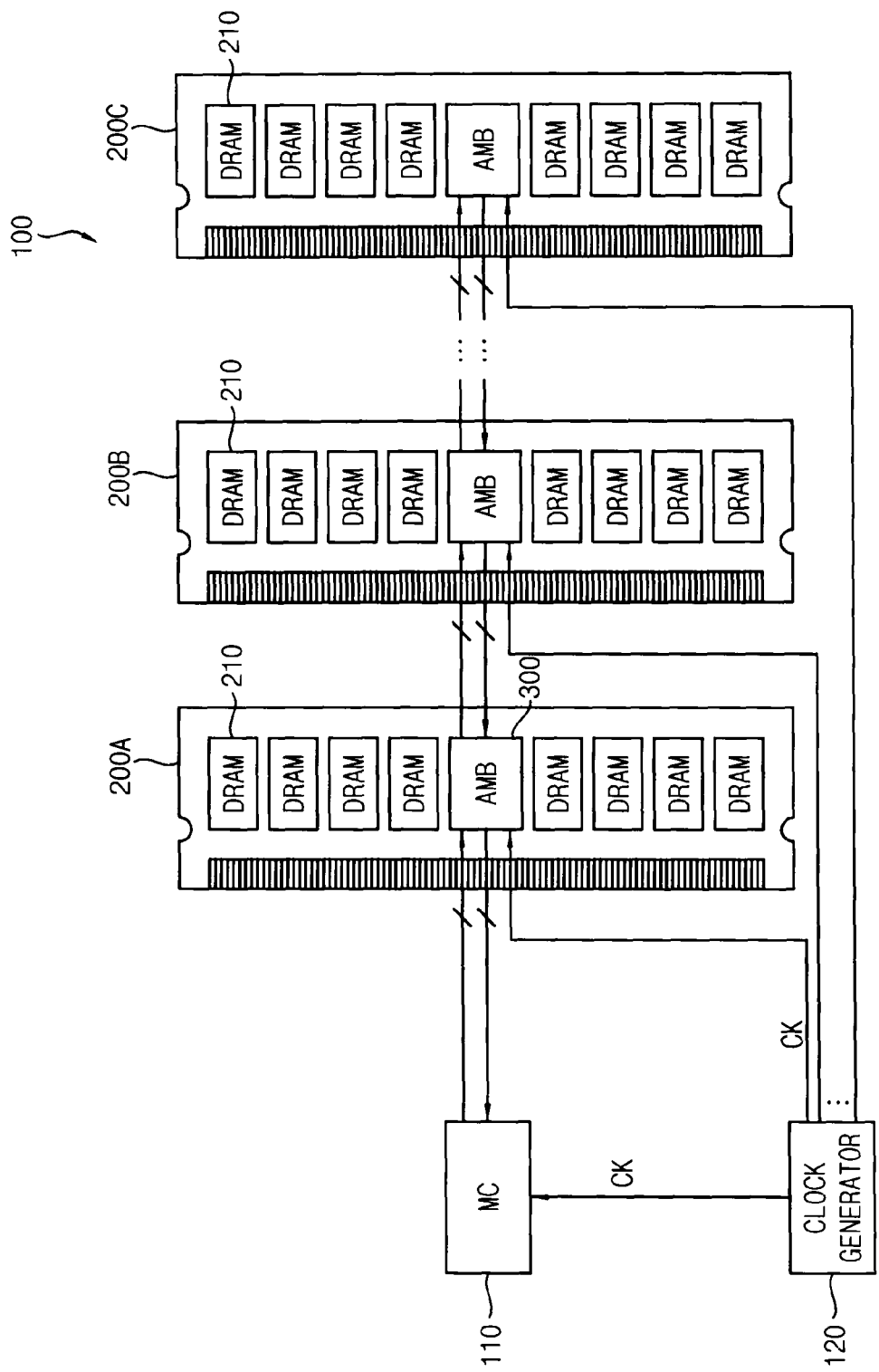
FIG. 1 is a block diagram illustrating memory modules and a memory system according to example embodiments.

Various example embodiments will be described more fully hereinafter with reference to the accompanying drawings, in which some example embodiments are illustrated. The example embodiments may, however, be embodied in many different forms and should not be construed as limited to the example embodiments set forth herein. Rather, these example embodiments are provided so that this disclosure will be thorough and complete, and will fully convey the scope of the example embodiments of the inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "includes," "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Memory devices include volatile memories such as dynamic random access memory (DRAM), static random access memory (SRAM), etc., and non-volatile memories which do not need to be refreshed, such as phase change random access memory (PRAM), resistive random access memory (RRAM) using variable resistance substances like complex metal oxides, and magnetic random access memory (MRAM) using ferromagnetic substances.

Due to the finite data retention feature of the DRAM, validity of data of a normal cell may not be guaranteed after a specified time has elapsed. According to one example refresh policy for DRAM, the time between refresh operations of a particular memory cell may be 64 ms, so that the particular memory cell is the subject of a refresh every 64 ms to maintain the data stored by the particular cell. However, as the size of the particular cell is reduced, the ability of the cell to retain data may also be reduced so that the cell should be refreshed more frequently, which may increase power consumption and reduce data input/output (I/O) bandwidth due to more bandwidth being allocated to refresh operations rather than data operations (i.e., reads and writes).

In addition, to safe-guarding the validity of data, different policies may be applied to different applications. For example, the adoption of an error correction circuit or the adoption of techniques to repair defective locations by substituting one address of a memory cell for another may also be used to improve data integrity. However, it may be difficult to adopt various policies within the DRAM chip itself, as production of different DRAM chips implementing different policies for different applications may increase development and production costs. Moreover, the use of the different policies may reduce the usefulness of DRAM as a general-purpose memory.

In the following description, according to example embodiments of the inventive concepts, semiconductor devices, memory modules, and systems which use various policies for improving memory operation characteristics are disclosed.

FIG. 1 is a block diagram illustrating memory modules and a memory system according to example embodiments.

Referring to FIG. 1, each of first through third memory modules 200A through 200C according to an example embodiment may include one or more devices (e.g., DRAMs) 210. A memory system 100 may include a memory controller 110 and the memory modules 200A through 200C, each of which has the device 210 mounted therein. The memory system 100 may further include a clock generator 120, and a clock signal generated from the clock generator 120 may be provided to the memory controller 110 or each memory module 200A through 200C.

Each memory module 200A through 200C illustrated in FIG. 1 is a fully-buffered dual in-line memory module (FB-DIMM), and includes an advanced memory buffer (AMB) 300. Each FBDIMM communicates with the memory controller 110, and the memory controller 110 and the AMB 300 in each module are connected in a point-to-point manner. The AMB 300 included in a memory module and the AMB 300 included in another memory module may transmit and receive packets there between. According to this scheme, the number of memory modules connected to the memory system 100 may be increased, thereby achieving high volume and allowing a high-speed operation because the FBDIMM uses a packet protocol.

Figure 2:
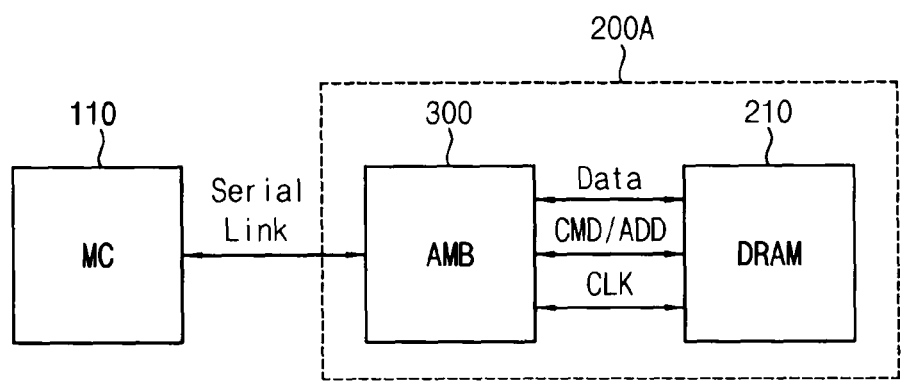
FIG. 2 is a block diagram of an example of a communication scheme of the memory system illustrated in FIG. 1.

FIG. 2 is a block diagram of an example of a communication scheme of the memory system illustrated in FIG. 1.

In FIG. 2, the memory controller 110 and the first memory module 200A are illustrated for convenience' sake. As illustrated in FIG. 2, the memory controller 110 and the AMB 300 of the first memory module 200A transmit and receive packets according to a serial communication scheme and using the Serial Link. The AMB 300 of the first memory module 200A transmits a packet to and receives a packet from the AMB 300 of an adjacent memory module (for example, the AMB of the second memory module 200B). The address ADD, the command CMD, the clock signal CLK and the data Data included in the packet is provided to the device 210 (e.g., the DRAM).

Figure 3:
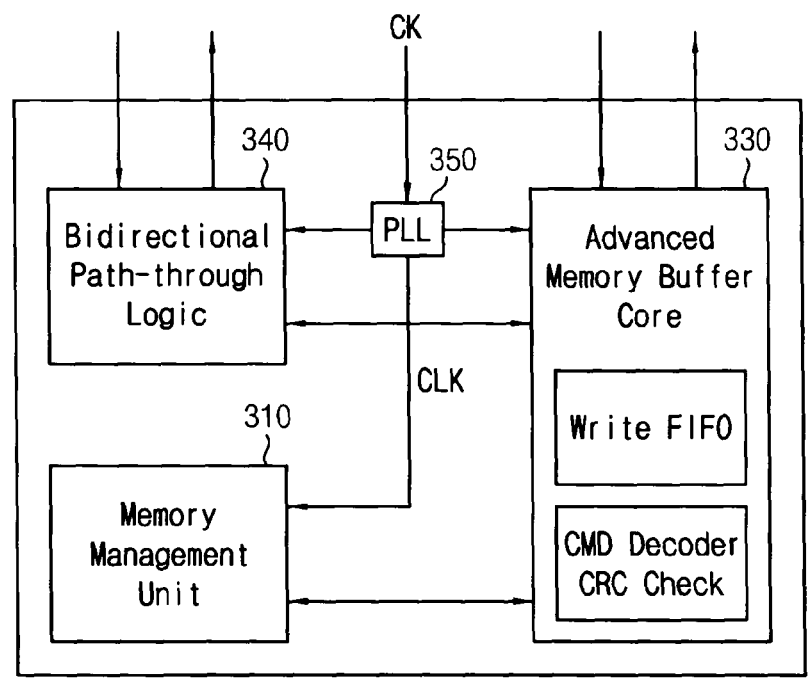
FIG. 3 is a block diagram of an example of the AMB in FIG. 1 according to an example embodiment.

FIG. 3 is a block diagram of an example of the AMB 300 in FIG. 1 according to an example embodiment.

As illustrated in FIG. 3, the AMB 300 may include a phase locked loop (PLL) 350 for receiving an external clock signal to generate a clock signal used in the AMB 300, an AMB core 330 for writing a packet received from outside, decoding the command CMD, or performing cyclic redundancy check (CRC) for checking damage of the packet, and a bidirectional path-through control logic 340 for controlling bidirectional forwarding of the packet. In particular, the AMB 300 may further include a DRAM (memory) management unit 310 to which various policies according to embodiments of the inventive concepts may be applied to perform integrated management for a memory.

Figure 4:
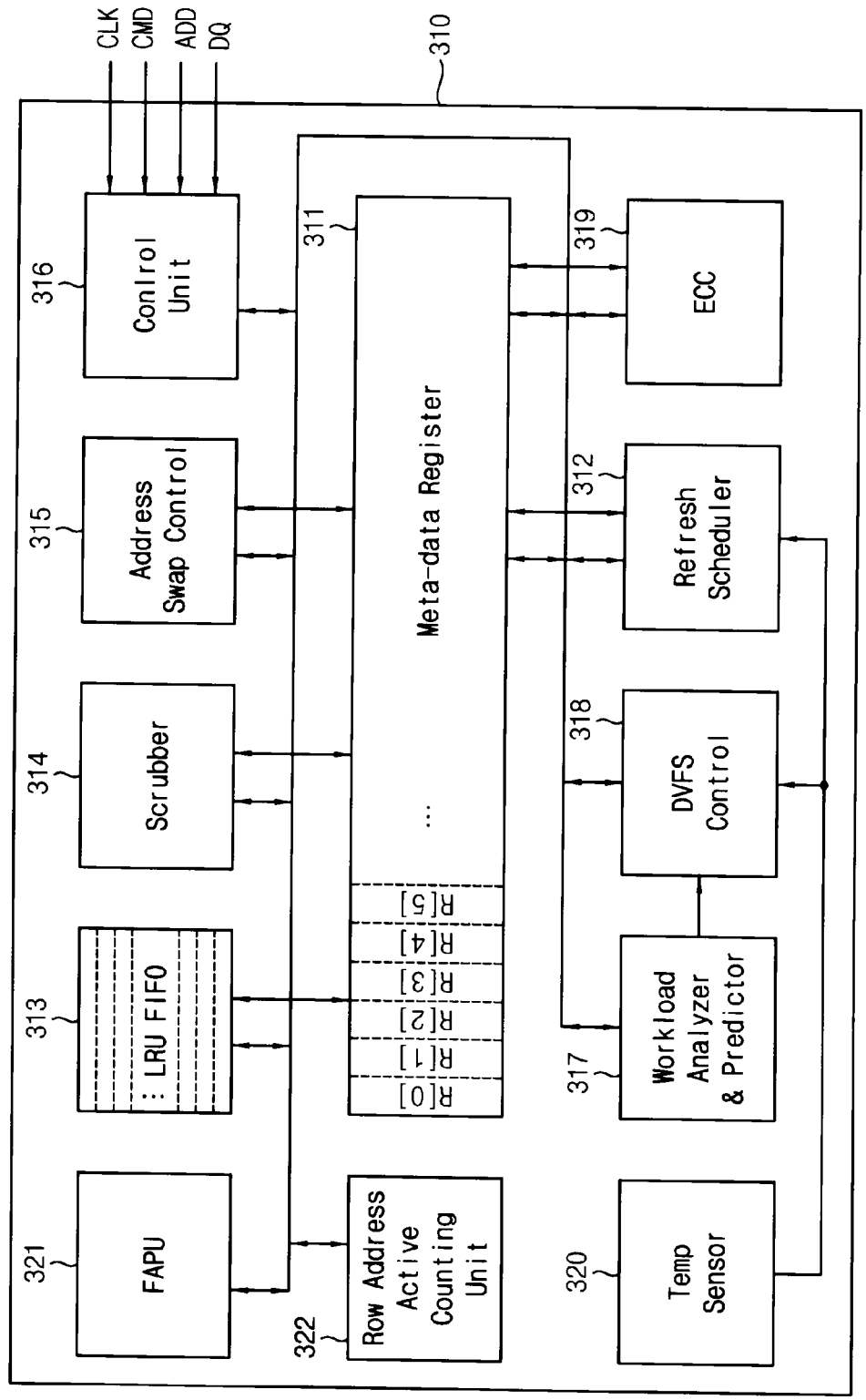
FIG. 4 is a block diagram of an example of the DRAM management unit illustrated in FIG. 3 according to an example embodiment.

FIG. 4 is a block diagram of an example of the DRAM management unit 310 illustrated in FIG. 3 according to an example embodiment.

Referring to FIG. 4, the DRAM management unit 310 may include a meta data storing unit 311 for storing memory device operational parameters (i.e., meta data) and a refresh scheduler 312 for managing the refresh operations with respect to the memory. The DRAM management unit 310 may include a control unit 316 for receiving the clock signal CLK, the command CMD, the address ADD, and the data DQ from outside or from the AMB core 320 and processing them, a least recently used (LRU)/first-in-first-out (FIFO) unit 313 for storing information of a desired (or, alternatively predetermined) number of addresses of the memory, a scrubber 314 for reading a memory cell to monitor whether there is a bit error in data stored in the memory, and an address swap control unit 315 for replacing an error page with a redundant page if an error which cannot be corrected occurs in that page of the memory. The DRAM management unit 310 may further include a workload analyzer/predictor 317 for analyzing and predicting a workload of an application (e.g., a computer system) in which the memory system is used, a dynamic voltage frequency scaling (DVFS) control unit 318 for controlling an operating voltage related to the read/write operations with respect to the memory, an error checking and correction (ECC) unit 319 for performing error detection and correction for data, and a temperature sensor 320 for sensing an ambient temperature and generating temperature information. In addition, the DRAM management unit 310 may further include a fail address processing unit 321 that includes a fail address table (FAT) for storing fail addresses that are addresses of pages whose errors the ECC unit 319 cannot correct and a row address active counting logic 322 for preventing a particular address being intensively accessed.

The meta data storing unit 311 may be implemented as a register in which m first through mth storage regions are allocated for m pages on a memory module.

Figure 5:
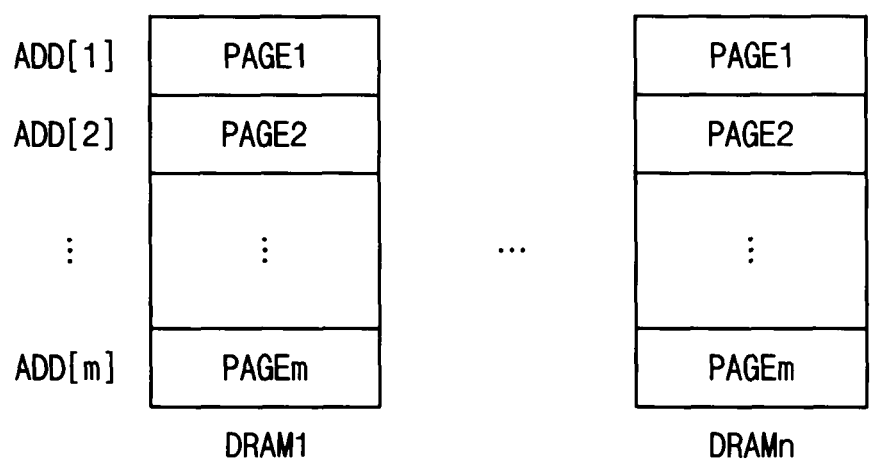
FIG. 5 illustrates example implementation of a page structure of a memory cell array.

FIG. 5 illustrates example implementation of a page structure of a memory cell array.

Illustrated in FIG. 5 are n DRAM chips DRAM 1 through DRAMn mounted on a module board, each of which may include a memory cell array having m pages. Upon application of a row address strobe (RAS) active command to a memory module, data in a selected page on the memory module is moved to a bit line sense amplifier. A page may be selected by the same address, and data of a desired (or, alternatively predetermined) byte size (e.g., data of 8 kbytes) is moved to the bit line sense amplifier by the single address on the memory module. Therefore, a refresh operation may be issued to the same page (for example, page 1) in DRAM 1, DRAM 2, ... DRAM M simultaneously using the memory device operational parameter value for page 1.

Figure 6:
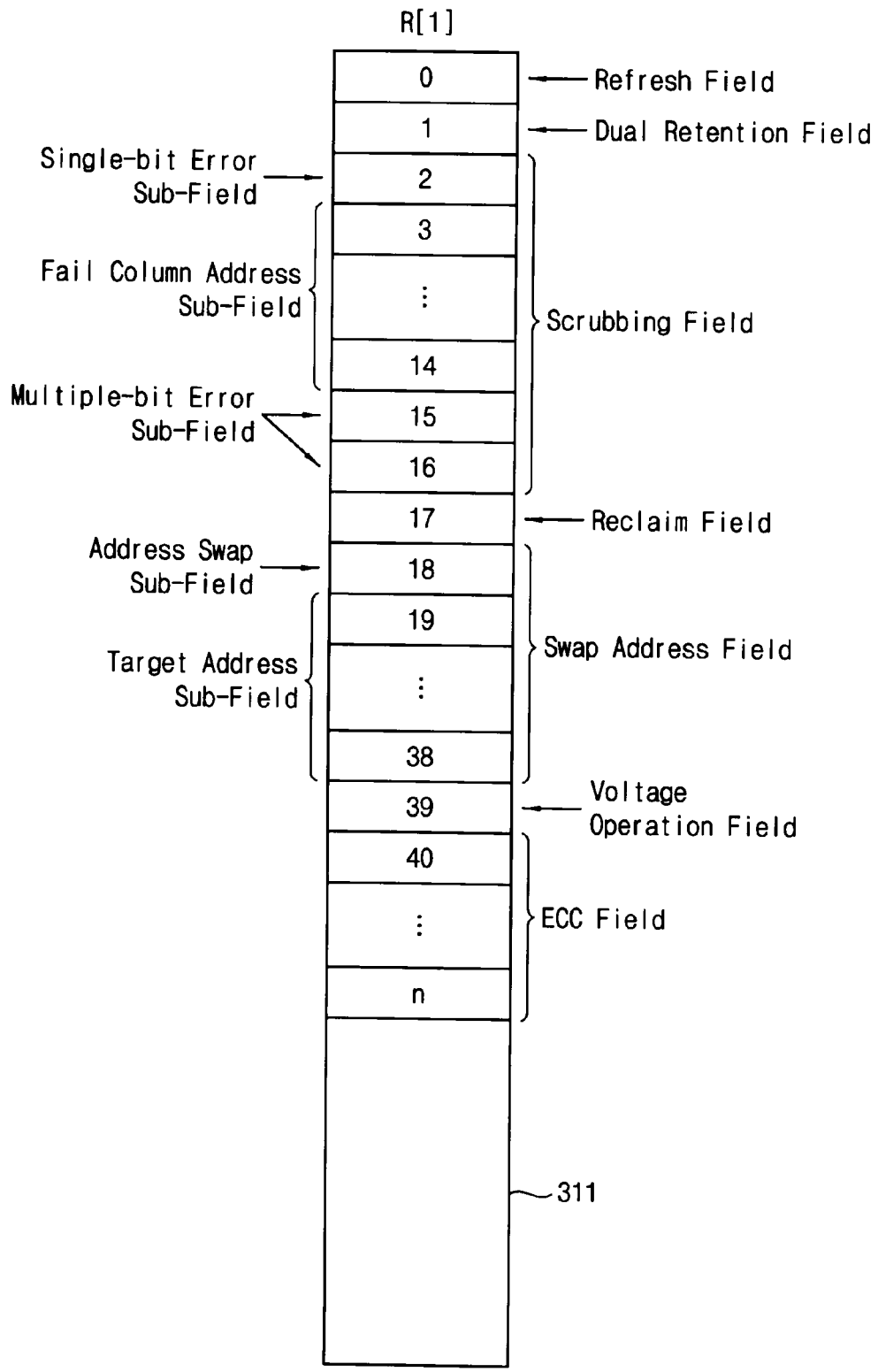
FIG. 6 illustrates an example of the meta data storing unit in FIG. 4 according to example embodiments.

FIG. 6 illustrates an example of the meta data storing unit in FIG. 4 according to example embodiments.

Referring to FIG. 6, the meta data storing unit 311 may be implemented as a register in which m first through mth storing regions R[1] through R[m] are allocated for the m pages on the memory module. In FIG. 6, one of the storage regions, e.g., the first storage region R[1], is illustrated as an example, and the first storage region R[1] includes a buffer of a desired (or, alternatively predetermined) size and is composed of a plurality of fields. In FIG. 6, numbers illustrated in the first storage region R[1] indicate bit orders of the buffer.

The first storage region R[1] may include a refresh field value related to execution of the refresh operation that stores refresh field values, the dual retention field storing dual retention field values related to the refresh time intervals, a scrubbing field related to a scrubbing operation, a reclaim field related to reclaiming of data stored in the memory, a swap address field related to address swap of an error page, a voltage operation field related to voltages of the read/write operations with respect to the memory, and an ECC field related to ECC. The scrubbing field may include a sub-field having information related to a single-bit error(s), a sub-field having address information of a fail column, and a sub-field having information indicating whether a multi-bit error occurs in a page. The swap address field may include a sub-field indicating whether an error which cannot be corrected occurs in a page corresponding to a desired (or, alternatively predetermined) address, and a sub-field having address information of a redundant page. With reference to FIGS. 4 and 6, a description will be made of operations of a memory module and a semiconductor memory system structured as described above according to another example embodiment of the inventive concepts.

To monitor whether a single-bit error occurs in a memory (e.g., the memory device 201 illustrated in FIG. 1, the scrubber 314 periodically performs a scrubbing operation by reading the memory. The scrubber 314 of the memory management unit 310 performs a scrubbing operation on each page of the memory cell array, and upon occurrence of a single-bit error resulting from the scrubbing operation, stores the result in the scrubbing field of the meta data storing unit 311. For example, if the single-bit error sub-field is composed of a buffer of 1 bit and a single-bit error occurs in the first page, the single-bit error sub-field of the scrubbing field of the first storing region R[1] has a value of "1".

Other information resulting from the scrubbing operation with respect to each page of the memory cell array is stored in the scrubbing field of the meta data storing unit 311. For example, the fail column address sub-field is composed of a buffer of 12 bits, and a column address in which the single-bit error occurs is stored in the fail column address sub-field. If two or more errors are detected in a page, information indicating so is stored in a scrubbing field of a storing region corresponding to that page. For example, when a multi-bit error sub-field of a scrubbing field is composed of a buffer of 3 bits, in case of occurrence of a 2-bit failure, "001" is stored in the multi-bit error sub-field and in case of occurrence of a 3-bit failure, "010" is stored in the multi-bit error sub-field. In this way, in case of occurrence of a failure of other numbers of bits, information indicating so is stored in the multi-bit error sub-field. If a failure of 8 bits or more occurs, "111" is stored in the multi-bit error sub-field.

To perform the scrubbing operation, the scrubber 314 refers to a value of the scrubbing field stored in the meta data storing unit 311 and performs the scrubbing operation with respect to the memory cell array based on the referred value. For example, the scrubber 314 sequentially scrubs a plurality of pages, and refers to a value of the scrubbing field of the meta data storing unit 311 before performing the scrubbing operation with respect to each page. For a single-bit error sub-field of "0", the scrubber 314 does not perform the scrubbing operation with respect to a corresponding page; for a single-bit error sub-field of "1", the scrubber 314 performs the scrubbing operation with respect to a corresponding page. The fail column address sub-field is referred to for the scrubbing operation, such that when a page is scrubbed, an address is read from a corresponding fail column address sub-field and the scrubbing operation with respect to the page is performed using the read address as a start address.

When two or more failures occur in a page, for error correction of data, an ECC resource (e.g., an ECC parity) having more bits is used. In a normal write operation, a value of the multi-bit error sub-field of the scrubbing field is referred to and an ECC parity is further generated according to the reference result for error correction of data. For example, for a multi-bit error sub-field of "000", an ECC of 1 bit is used; for a multi-bit error sub-field of "011", an ECC of 4 bits are used. The ECC unit 319 illustrated in FIG. 4 generates an ECC parity for error correction of data by referring to the value of the multi-bit error sub-field. As described above, different bit numbers of an ECC parity is generated according to the value of the multi-bit error sub-field, and the generated ECC parity is stored in the ECC field of the meta data storing unit 311. To read data stored in the memory cell array, the original data may be determined using the data stored in the memory and an ECC parity stored in the ECC field.

Meanwhile, in a computer system where a memory, e.g., a DRAM, is used, if a central processing unit (CPU) requests a memory resource, previously stored data is removed in case of absence of an empty space in the memory, and a reclaiming operation for using a corresponding space provided by the removal for another purpose has to be performed. During the reclaiming operation, if data of a page of the memory cell array is the same as the original data present in a non-volatile storage device, e.g., a hard disk drive (HDD), the data of that page may be directly removed, but if the data is different from the original data (or the data of the page is dirty data), the corresponding space has to be used for another purpose after the data is moved to the HDD.

To manage the reclaiming operation, the meta data storing unit 311 of the memory management unit 310 of FIG. 4 includes a reclaim field in which information indicating whether each page of the memory cell array includes dirty data may be stored. Thus, when the reclaiming operation is performed, it may be checked from the reclaim field if data of each page needs to be backed up in the HDD, and based on the result, the reclaiming operation is performed. For example, if the data of the HDD is moved to the memory and then a page of the memory is opened for the read and/or write operations, the reclaim field of that page may be changed to "1".

The memory management unit 310 may include the LRU/FIFO unit 313 having a desired (or, alternatively predetermined) size, and address information of the page having the changed value of the reclaim field is stored in the LRU/FIFO unit 313. Address information of a desired (or, alternatively predetermined) number of pages of the memory cell array (e.g., 30% of total pages of the memory) may be stored based on the order of the recently used page first. For the reclaiming operation, address information stored in the LRU/FIFO unit 313 is provided to an external memory controller or CPU, and the reclaiming operation may be performed based on the provided address information. For example, the reclaiming operation is performed on pages corresponding to the addresses other than the address provided to the external memory controller or CPU.

If an error which cannot be corrected occurs in a page of the memory, the address swap control unit 315 of the memory management unit 310 performs an operation for replacing an error page with a redundant page. To this end, the meta data storing unit 311 includes a swap address field which may include a first sub-field having address information of a page in which an error occurs and a second sub-field having address information of a redundant page for replacing the error page.

The redundant page is selected by generating an address that is not accessible from outside of a memory device or a memory module. If an error which cannot be corrected occurs in a desired (or, alternatively predetermined) page, a value of the first sub-field of the swap address field corresponding to that page is changed, for example, by writing "1" to the first sub-field, information about whether to change the page into another page is included. If a page to be read or written is a target of an address swap, address information of a redundant page stored in the second sub-field is read and the address of the redundant page is provided to the memory.

The DVFS control unit 318 of the memory management unit 310 manages information related to an operating voltage of the read/write operations with respect to the memory. To this end, the meta data storing unit 311 may include a voltage operation field related to the voltages of the read/write operations with respect to the memory. Information related to levels of voltages used in data read/write operations with respect to the memory is stored in the voltage operation field, and such voltage-level-related information is stored page-by-page.

When data is written to the memory, for example, the data is written in a page with a voltage of 1V and then data of that page is read with a voltage of 1.1V, a margin of data "1" may be more vulnerable than a margin of data "0". Thus, information related to levels of operating voltages is stored in the voltage operation field page-by-page, and then at execution of various operations, such as a read operation, a refresh operation, etc., the information stored in the voltage operation field is referred to.

To reduce power consumption in a semiconductor device or a memory module, the workload analyzer/predictor 317 analyzes a workload and provides the analysis result, such that for a small workload, the DVFS control unit 318 lowers a voltage level provided to a DRAM cell, for example, a level of an operating voltage of a memory is lowered from 1.1 V to 1.0V. In addition, information related to a voltage level is written in a voltage operation field corresponding to a page operated with a low voltage. For example, when a page is operated with a low voltage, "1" is written to the voltage operation field corresponding to the page. During a subsequent operation, for example, the refresh operation, the refresh scheduler 312 may refer to the voltage operation field of the meta data storing unit 311 and control the refresh operation according to the reference result.

The number of bits of the voltage operation field may be determined according to a type of a changeable voltage or the number of changeable voltages. For example, when a voltage level changes at four steps of 1.2V, 1.1V, 1.0V, and 0.9V, the voltage operation field may include a buffer of 2 bits. If the write operation with respect to a page of the memory is performed with a low voltage of 0.9V or 1.0V, the page is first refreshed through the refresh operation performed with a normal voltage. For example, at the time of entry to a normal-voltage mode from a low-voltage mode, the voltage operation field of the meta data storing unit 311 is scanned and the page operated (written) at a low voltage level is refreshed with a normal voltage. For this end, the refresh operation may include a continuous refresh scheme for continuously refreshing a plurality of pages and a dispersed refresh scheme for refreshing the pages in a dispersed way. Upon start of a refresh period, pages operated with a low voltage are continuously refreshed, and after completion of the refresh operation, values of voltage operation fields corresponding to the pages are changed. Thereafter, for the remaining pages, the refresh operation is performed in the above-described manner. In case of switch from the normal-voltage mode to the low-voltage mode, if a page is opened for an operation such as the write operation, etc., a value of the voltage operation field corresponding to the opened page is changed.

The fail address processing unit 321 stores addresses of memory cell rows having multi-bit errors that the ECC unit 319 cannot correct as the fail address.

The row address activating counting unit 322 may output an intensive address designating an intensive accessed memory cell row based on access frequency of memory cell rows, when the intensive accessed memory cell row is accessed more than a threshold value during desired (or, alternatively predetermined) time interval. The refresh scheduler 312 receives the intensive address and preferentially refreshes neighboring memory cell rows adjacent to the intensive accessed memory cell row. By preferentially refreshing neighboring memory cell rows adjacent to the intensive accessed memory cell row, lost charges of memory cells in the neighboring memory cell rows may be recovered.

Figure 7:
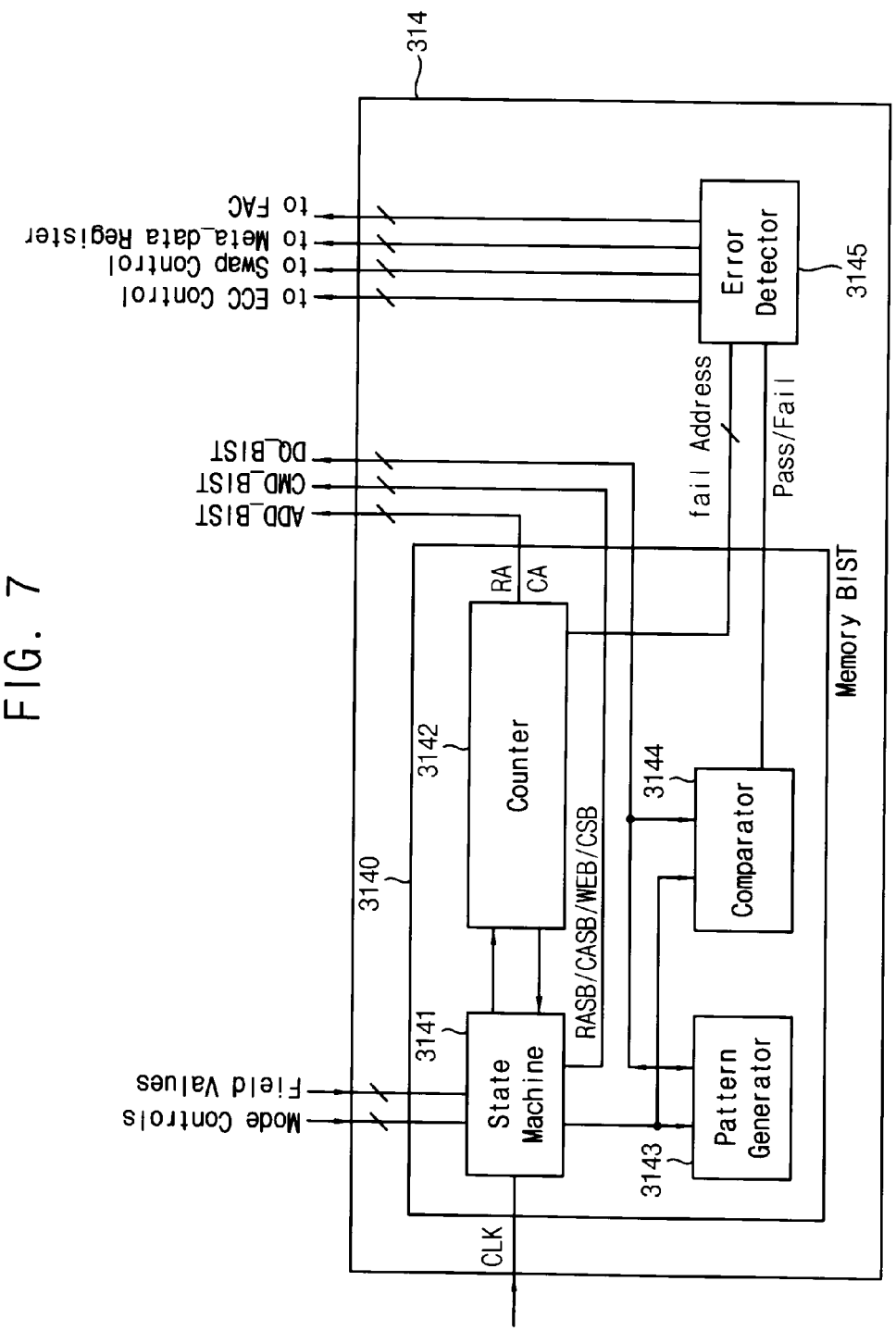
FIG. 7 is a block diagram illustrating an example of the scrubber in FIG. 4 according to example embodiments.

FIG. 7 is a block diagram illustrating an example of the scrubber in FIG. 4 according to example embodiments.

Referring to FIG. 7, the scrubber 314 may include a memory BIST unit 3140 for monitoring occurrence of an error in the memory cell array and an error detector 3145 for performing error detection by using a test result provided from the memory BIST unit 3140. The memory BIST unit 3140 may include a state machine 3141 for generating various commands CMD_BIST for overall controlling of a monitoring operation or a test operation, a counter 3142 for generating a test address ADD_BIST for selecting a memory cell, a pattern generator 3143 for generating a data pattern DQ_BIST for the test operation, and a comparator 3144 for comparing the data pattern DQ_BIST with a pattern read from the memory cell.

The state machine 3141 receives mode control signals Mode Controls or field values Field Values to generate the command CMD_BIST and various control signals. For example, in response to the mode control signals Mode Controls, the operation of the scrubber 314 may be switched on/off. The state machine 3141 may control address generation of the counter 3142 or pattern generation of the pattern generator 3143 by referring to the field values Field Values. The data pattern DQ_BIST is stored in the memory cell, and after a desired (or, alternatively predetermined) time, the memory cell is read. The comparator 3144 provides a result of comparison between the original data pattern DQ_BIST with the pattern read from the memory cell to the error detector 3145.

The error detector 3145 detects occurrence of a single-bit error in a page, address information of a column in which the error occurs, and the number of bits of the error occurring in the page, based on the comparison result. The error detector 3145 writes information corresponding to the detection result in the scrubbing field. If a multi-bit error occurs in a page, information indicating so is provided to the ECC unit 319 to allow the ECC unit 319 to generate an ECC parity corresponding to the multi-bit error. If a plural-bit error occurs in a desired (or, alternatively predetermined) page and thus error correction is not possible, information indicating so may be provided to the address swap control unit 315.

Figure 8:
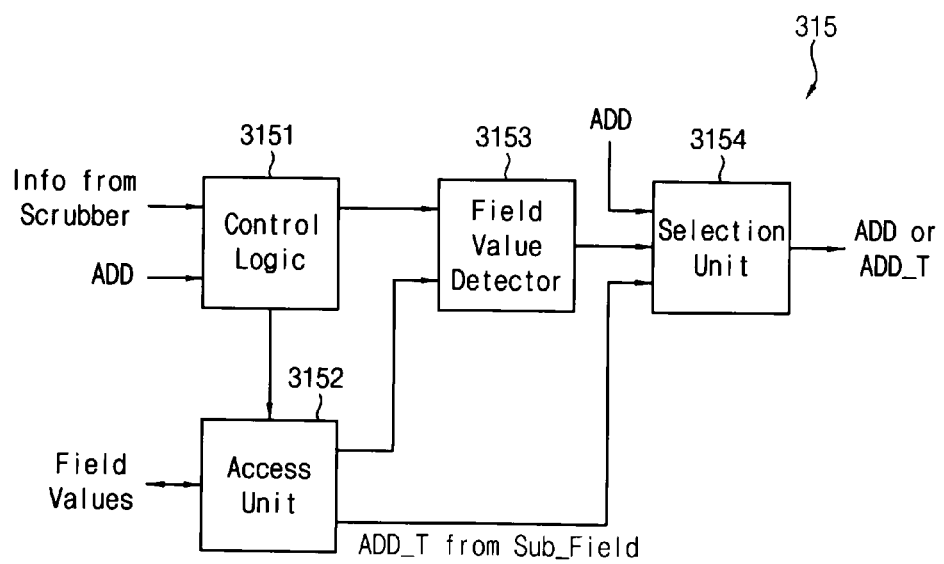
FIG. 8 is a block diagram illustrating an example of the address swap control unit in FIG. 4 according to example embodiments.

FIG. 8 is a block diagram illustrating an example of the address swap control unit in FIG. 4 according to example embodiments.

Referring to FIG. 8, the address swap control unit 315 may include a control logic 3151 for overall controlling an address swap operation, an access unit 3152 for accessing the meta data storing unit 311 to write or read a field value, a field value detector 3153 for detecting a value of the swap address field of a page corresponding to an address, and a selection unit 3154 for selectively outputting the original address or a redundant address according to a result of detecting the field value.

The control logic 3151 may receive a scrubbing result from the scrubber 314 illustrated in FIG. 4, and set or update the swap address field of the meta data storing unit 311 in response to the scrubbing result. The control logic 3151 controls the access unit 3152 in response to the scrubbing result, changes a value of the first sub-field of the swap address field corresponding to a page where an error which cannot be corrected occurs into "1", and writes an address of a redundant page for replacing the page where the error occurs in the second sub-field of the swap address field.

Thereafter, upon receiving the address ADD for the read/write operations with respect to the memory cell array, the control logic 3151 controls the access unit 3152 to access the value of the swap address field corresponding to the address ADD. The field value detector 3153 receives the value of the first sub-field corresponding to the address ADD, detects whether the value of the first sub-field is "1" or "0", and provides the detection result to the selection unit 3154. The selection unit 3154 outputs the address ADD for the first sub-field of "0", and outputs an address ADD_T of the redundant page, written in the second sub-field of the swap address field, for the first sub-field of "1". Thus, the address swap operation for using the redundant page is performed outside a DRAM chip (e.g., an AMB chip on a module), and the swapped address is provided to the DRAM chip, such that the page in which the error cannot be corrected, is replaced with the redundant page.

Figure 9:
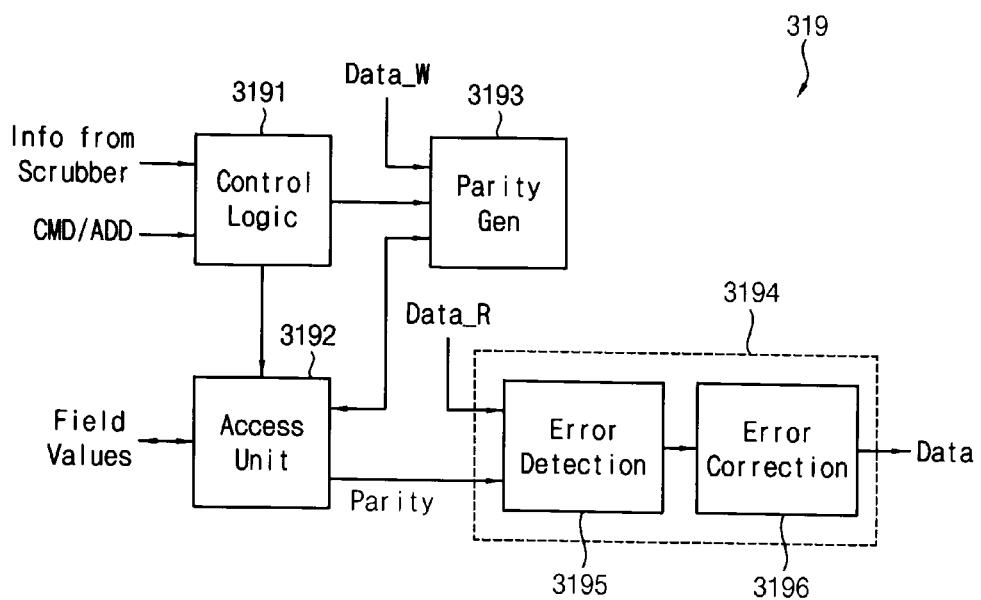
FIG. 9 is a block diagram illustrating an example of the ECC unit in FIG. 4 according to example embodiments.

FIG. 9 is a block diagram illustrating an example of the ECC unit in FIG. 4 according to example embodiments.

Referring to FIG. 9, the ECC unit 319 may include a control logic 3191 for controlling an overall operation for error correction, an access unit 1392 for accessing the meta data storing unit 311 to write or read a field value related to an ECC operation, a parity generator 3193 for generating an ECC parity corresponding to write data Data_W by referring to the write data Data_W and a field value of the meta data storing unit 311, and an ECC decoder 3194 for generating error-corrected data Data by using data Data_R read from the memory cell array and the ECC parity. The ECC decoder 3194 may include an error detection unit 3195 for detecting occurrence of an error from the read data and an error correction unit 3196 for performing error correction based on the error detection result.

The control logic 3191 may receive the scrubbing result from the scrubber 314 illustrated in FIG. 4, and control the ECC operation by referring to a field value stored in the meta data storing unit 311, for example, a value of the multi-bit error sub-field. The control logic 3191 may generate various control signals for the ECC operation in response to the command CMD related to the read/write operations. The access unit 3192 accesses a field value of the meta data storing unit 311 under the control of the control logic 316, and provides the accessed field value to various circuit blocks in the ECC unit 3194 for control of the ECC operation.

For instance, upon application of a write command with respect to a desired (or, alternatively predetermined) page, the access unit 3192 accesses a value of the multi-bit error sub-field of the meta data storing unit 311 and provides the accessed sub-field value to the parity generator 3193. The parity generator 3193 then generates ECC parity having different bit numbers according to the value of the multi-bit error sub-field. Hence, the ECC parity having different bit numbers for different write data Data_W is generated and provided to the access unit 3192. The access unit 3192 writes the generated ECC parity in the ECC field of the meta data storing unit 311 corresponding to the page on which the written operation is to be performed.

Upon application of a read command with respect to a desired (or, alternatively predetermined) page, the access unit 3192 reads ECC parity recorded in the ECC field corresponding to the page and provides the read ECC parity to the ECC decoder. The error detection unit 3195 and the error correction unit 3196 perform error detection and error correction with respect to the read data Data_R by using the read data Data_R and the ECC parity, and provides the error-corrected data Data to outside.

Figure 14:
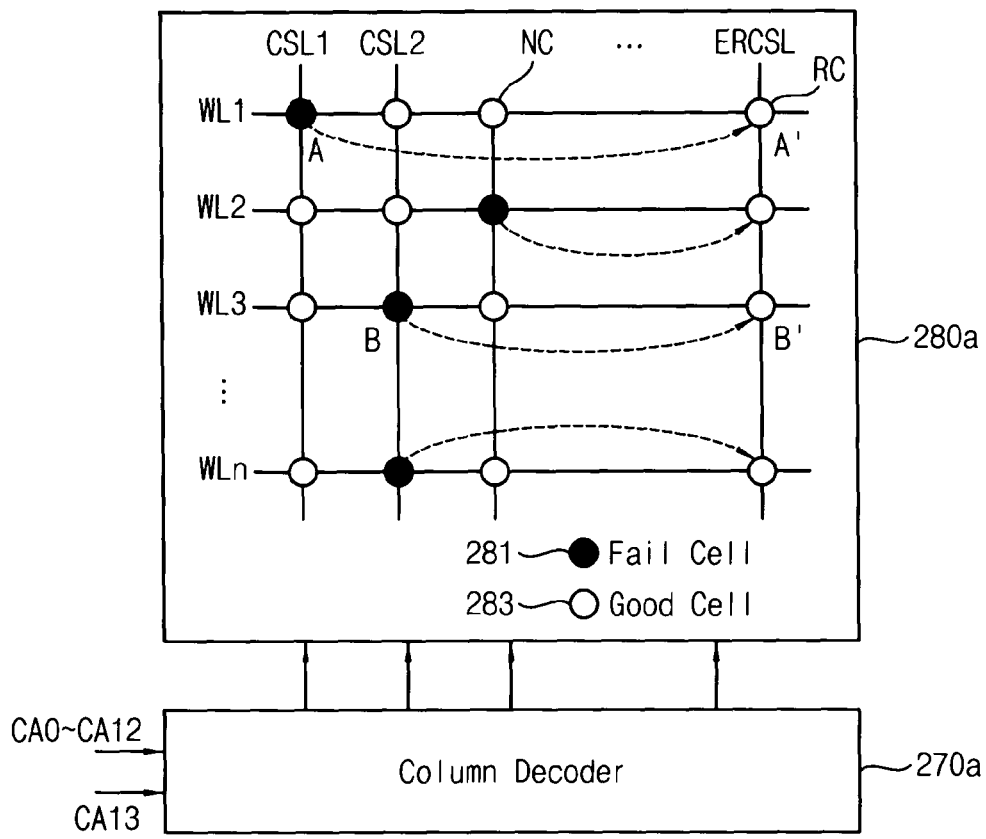
FIG. 14 illustrates one bank memory array and one bank column decoder in FIG. 13.

In addition, the ECC unit 319 may correct errors of the memory cell including uncorrectable errors by selectively using the spare column in FIG. 14 based on the BIST performed in the scrubber 314.

Figure 10:
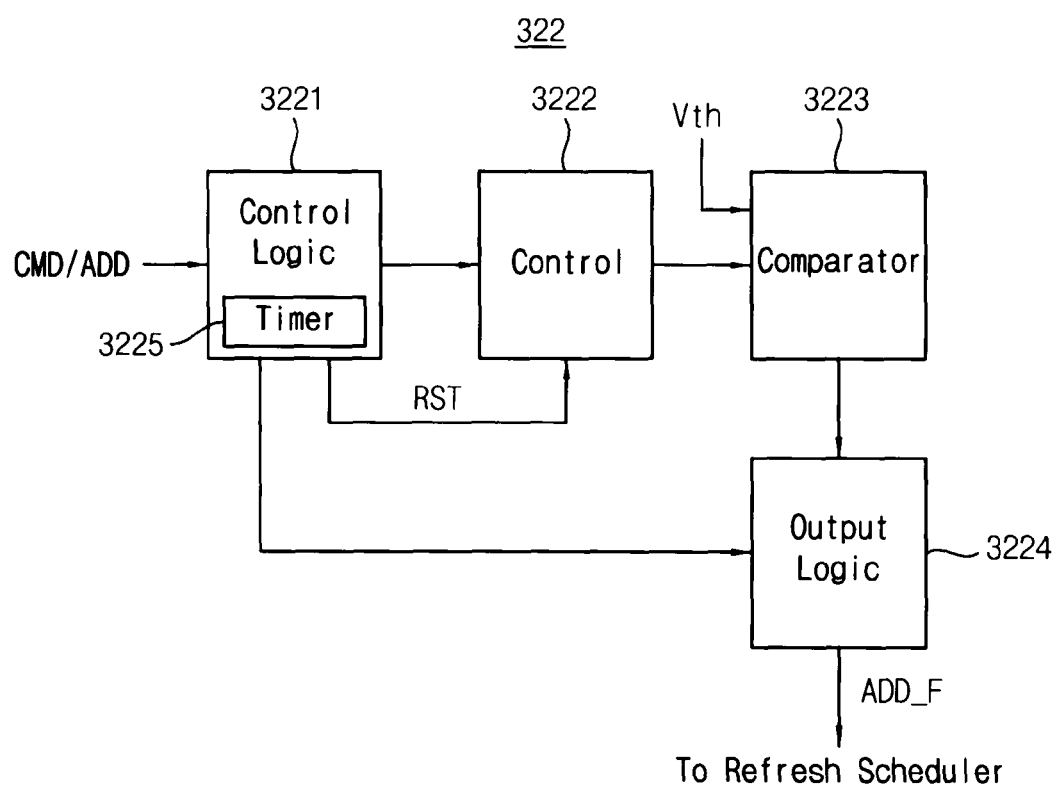
FIG. 10 is a block diagram illustrating an example of the row address activation counting unit in FIG. 4 according to example embodiments.

FIG. 10 is a block diagram illustrating an example of the row address activation counting unit in FIG. 4 according to example embodiments.

As the fabrication process of the memory device is scaled down, space between word-lines becomes narrower. Therefore, disturbance phenomenon occurs more frequently than before, in which charge of the memory cell connected to one word-line is influenced by voltage distribution of adjacent word-line. That is, when one particular word-line is intensively accessed, the disturbance phenomenon increases in which the charge of the memory cell connected to neighboring word-lines adjacent to the particular word-line is lost due to activated voltage of the particular word-line.

Referring to FIG. 10, the row address activation counting unit may include a control logic 3221 for controlling monitoring operation of intensive access to one particular row, a counter 3222, a comparator 3223 and an output logic 3224.

The control logic 3221 receives command CMD and address ADD which are associated with activation of a memory cell row, and outputs an output signal with high level to the counter 3222 whenever the address ADD is received. The counter 3222 counts a number of the output signal with high level to provide a counting value to the comparator 3223. The comparator 3223 compares the counting value and a threshold value Vth and provides an output signal with high level to the output logic 3224 when the counting value exceeds the threshold value Vth. When the output logic 3224 receives the output signal with high level from the comparator 3223, the output logic 3224 output the address from the control logic 3221 as an intensively accessed address ADD_F to the refresh scheduler 312 in FIG. 4. When the refresh scheduler 312 receives the intensively accessed address ADD_F, the refresh scheduler 312 preferentially refreshes neighboring memory cell rows adjacent to the intensive accessed memory cell row corresponding to the intensively accessed address ADD_F than other memory cell rows.

The comparator 3223 provides an output signal with low level to the output logic 3224 when the counting value does not exceed the threshold value Vth. The control logic 3221 may reset the counter 3222 by providing a reset signal RST to the counter 3222 in response to the output signal with low level. The row address activation counting unit may provide the refresh scheduler 312 with intensive access information such that the neighboring memory cell rows adjacent to the intensively accessed memory cell row are preferentially refreshed when one row is intensively accessed during desired (or, alternatively predetermined) time interval. The control logic 3221 may include a timer 3225 for checking the desired (or, alternatively predetermined) time interval. The timer 3225 may start to operate whenever the address (or access address) ADD is received and may be reset after the desired (or, alternatively predetermined) time interval elapses. The desired (or, alternatively predetermined) time interval may correspond to a refresh period of the memory device.

Figure 11:
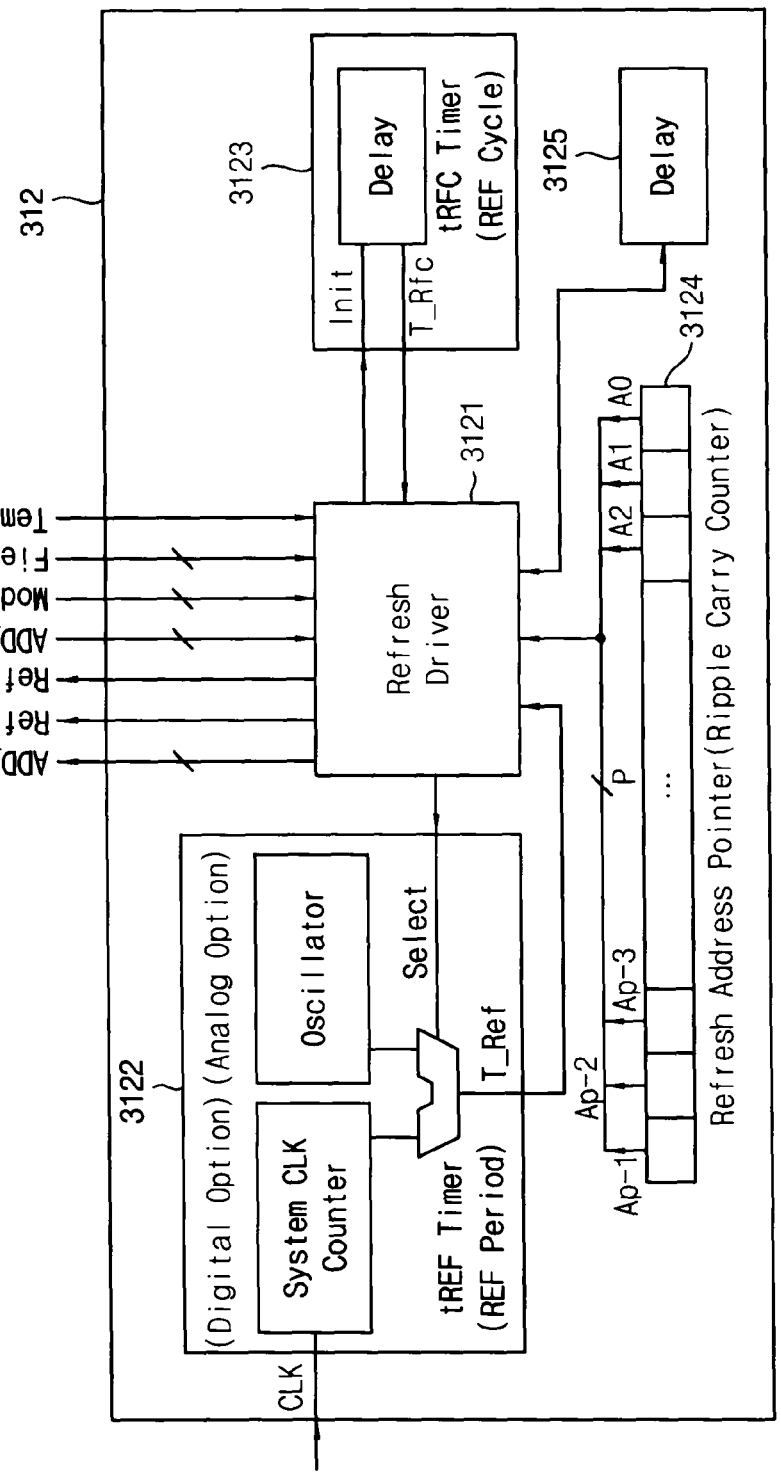
FIG. 11 is a block diagram illustrating an example of the refresh scheduler in FIG. 4 according to example embodiments.

FIG. 11 is a block diagram illustrating an example of the refresh scheduler in FIG. 4 according to example embodiments.

Referring to FIG. 11, the refresh scheduler 312 may include a refresh driver 3121 for performing overall control of operations related to refresh, a period information generator 3122 for generating period information T_Ref related to a refresh time interval by counting the clock signal CLK, a cycle information generator 3123 for generating cycle information T_Rfc related to a refresh cycle based on a delay operation, and a refresh address pointer 3124 for generating a refresh address. The refresh address pointer 3124 may be implemented as a ripple carry counter in a form in which toggle flip-flops as many as bits of a row address are connected in series. If an address for selecting a page of a memory cell array includes p bits, the refresh address pointer 3124 generates a p-bit refresh address. The refresh scheduler 312 may manage a refresh operation by comparing the value of a memory device operational parameter in the storage circuit with at least one master flag, and to this end, may further include a master flag storing unit 3125 for storing the master flag value. Various information generated in the refresh scheduler 312 may be used as the master flag, and for example, one or more bits of the refresh address generated by the refresh address pointer 3124 may be used as the master flag.

The period information generator 3122 may generate the period information T_Ref related to a refresh time interval according to a digital scheme or an analog scheme. In FIG. 5, it is illustrated that a component for generating the period information T_Ref by counting the clock signal CLK and a component for generating an oscillation signal from an oscillator as the period information T_Ref are included in the period information generator 3122, and a multiplexer for providing one of the clock signal CLK and the oscillation signal as the period information T_Ref is further included in the period information generator 3122. However, the period information generator 3122 may also generate the period information T_Ref according to one of the digital scheme and the analog scheme. The cycle information generator 3123 is provided with a signal Init indicating the start of a refresh period from the refresh driver 3121, and generates the cycle information T_Rfc related to a refresh cycle by delaying the signal Init.

The refresh driver 3121 receives various control signals and information related to the refresh operation, such as Mode Controls, Field Values, Temp, etc. In addition, the refresh driver 3121 receives the intensively accessed row address ADD_F. As one of various commands and information, mode control signals Mode Controls related to an operation mode may be provided to the refresh driver 3121. The mode control signals Mode Controls may be control commands provided from outside, or may be results of decoding an external command CMD of the control unit 316 in FIG. 4. In response to the mode control signals Mode Controls, the operation mode of the refresh scheduler 312 is controlled, and for example, the operation of the refresh driver 3121 may be switched on or off. The field values Field Values may be a memory device operational parameter that is used to affect the operation of refresh for different pages differently. The temperature information Temp may be referred to for setting a refresh time interval, and may be provided from the temperature sensor 320 in FIG. 4 to the refresh driver 3121.

The refresh driver 3121 receives the refresh address ADD_Ref generated from the refresh address pointer 3124 and provides the same to the DRAM chip in FIG. 1. Accordingly, the ADD_Ref generated from the refresh address pointer 3124 may provide the basis for a requested refresh operation to be performed on the page corresponding to ADD_Ref. In particular, to provide the refresh address ADD_Ref, the refresh driver 3121 compares a refresh field value for the page corresponding to the refresh address ADD_Ref with the master flag value and selectively performs the requested refresh operation on the page corresponding to the refresh address ADD_Ref based on the result of the comparison. For example, for the refresh operation, various refresh commands Refresh Begin and Refresh End including refresh period and cycle information and the refresh address ADD_Ref for selecting a page are provided to the DRAM chip. By providing the refresh address ADD_Ref of the page on which the refresh operation is to be actually performed to the DRAM chip according to the result of comparison between the field value and the master flag value, the refresh operation may be selectively performed.

In addition, when the refresh driver 3121 receives the intensively accessed row address ADD_F from the row address activation counting logic 322, the refresh driver 3121 preferentially refreshes neighboring memory cell rows adjacent to the intensive accessed memory cell row corresponding to the intensively accessed address ADD_F than other memory cell rows by adjusting some bits of the intensively accessed row address ADD_F and providing the refresh address ADD_REF of the neighboring memory cell rows to the memory device. The refresh operation on the neighboring memory cell rows may be RAS only refresh (ROR). In the ROR, the refresh operation is performed by enabling row address strobe (RAS) signal while maintaining column address strobe (CAS) signal at precharge level.

Figure 12:
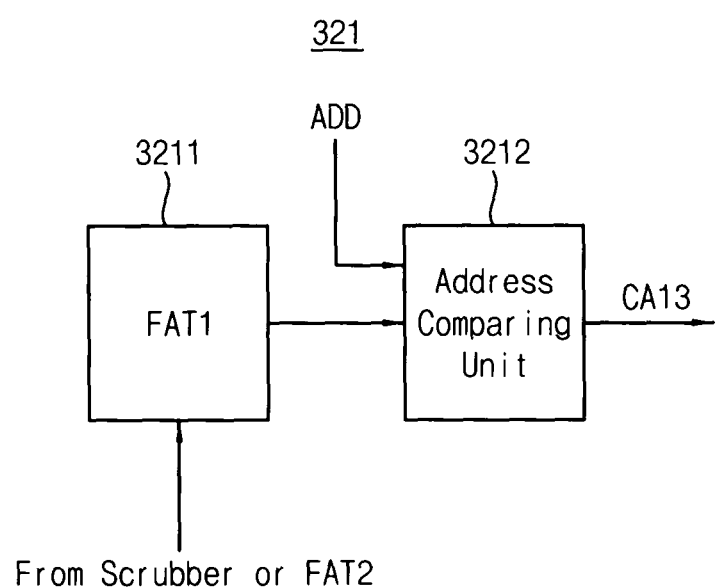
FIG. 12 is a block diagram illustrating an example of the fail address processing unit in FIG. 4 according to example embodiments.

FIG. 12 is a block diagram illustrating an example of the fail address processing unit in FIG. 4 according to example embodiments.

Referring to FIG. 12, the fail address processing unit 321 may include a first fail address table 3211 and an address comparing unit 3212. The first fail address table 3211 stores at least one fail address of at least one page including errors which are uncorrectable by the ECC unit 319 as fail address information. The address comparing unit 3121 compares the access address ADD for accessing the memory device with the at least one fail address to selectively enable a spare column address signal CA13 to a column decoder of the memory device based on the comparison result. For example, when the access address ADD matches with at least one of the fail address, the address comparing unit 3121 outputs the spare column address signal CA13 with high level. When the spare column address signal CA13 has a high level, memory cells corresponding to the fail address may be replaced with redundant cells corresponding the spare column address in a corresponding memory device. When the access address ADD does not matches with the fail address, the address comparing unit 3121 outputs the spare column address signal CA13 with low level. When the spare column address signal CA13 has a low level, the corresponding memory device may perform normal column access operation.

The at least one fail address stored in the first fail address table 3211 may be transmitted from the error detection unit 3145 of the scrubber 314 or each second fail address table included in each of the memory devices.

Figure 13:
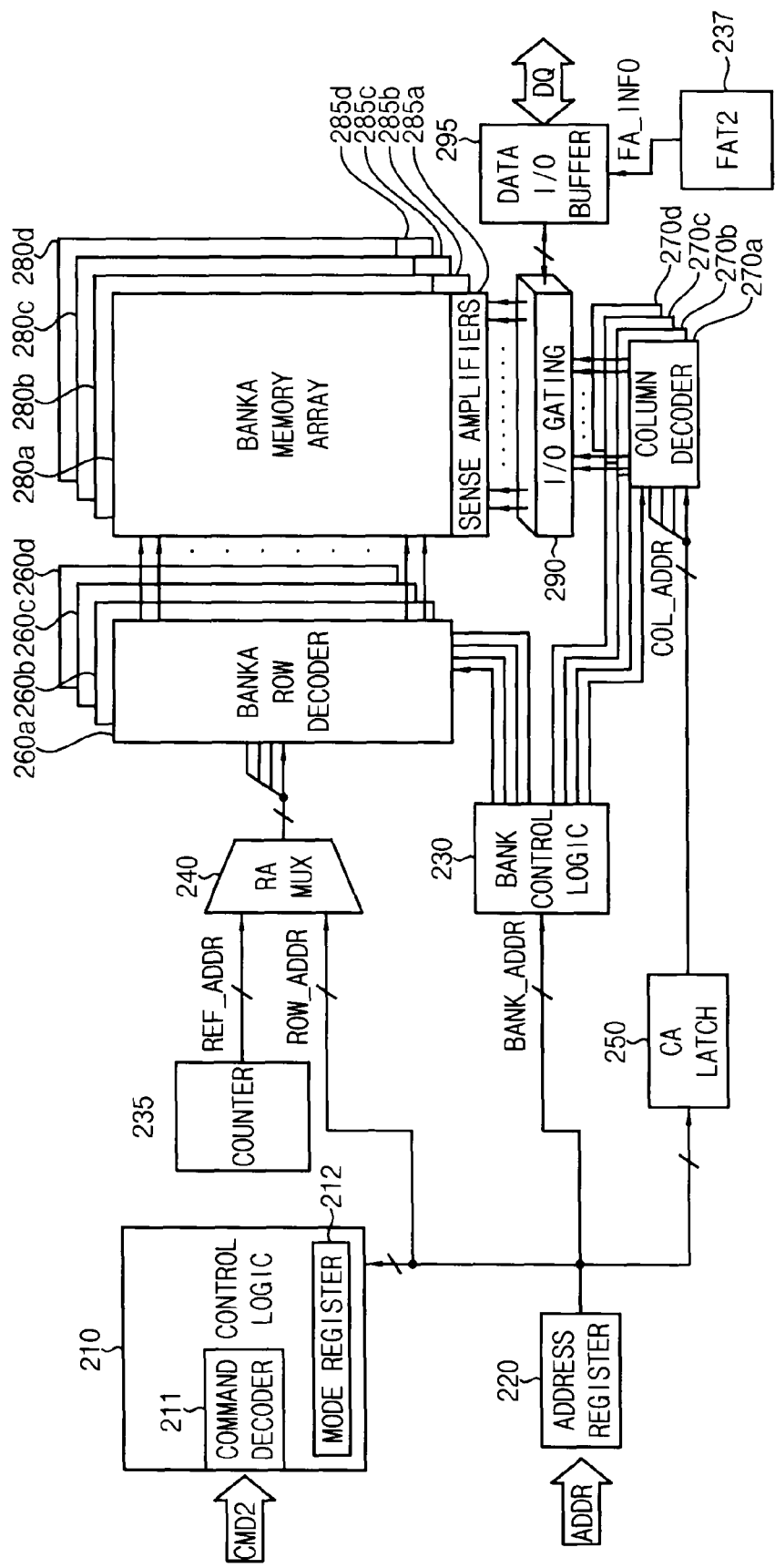
FIG. 13 is a block diagram illustrating one of the memory devices in FIG. 1 according to example embodiments.

FIG. 13 is a block diagram illustrating one of the memory devices in FIG. 1 according to example embodiments.

Referring to FIG. 13, the memory device 201 includes a control logic 210, an address register 220, a bank control logic 230, a row address multiplexer 240, a second fail address table 237, a refresh counter 235, a column address latch 250, a row decoder, a column decoder, a memory cell array, a sense amplifier unit, an input/output gating circuit 290 and a data input/output buffer 295. In some example embodiments, the memory device 201 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 385c and 385d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the volatile memory device 200 is illustrated in FIG. 3 as including four banks, the volatile memory device 200 may include any number of banks.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 235. The row address multiplexer 240 may selectively output the row address ROW_ADDR or the refresh row address CREF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provide from the memory controller to the data input/output buffer 295. The data DQ provided to the data input/output buffer 295 may be written to the one array bank via the write drivers.

The control logic 210 may control operations of the memory device 200a. For example, the control logic 210 may generate control signals for the memory device 200a to perform a write operation or a read operation. The control logic 210 may include a command decoder 211 that decodes a command CMD received from the memory controller and a mode register 212 that sets an operation mode of the memory device 201. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the memory device 201 in a synchronous manner.

The second fail address table 237 stores self fail address information FA_INFO on fail address of fail cells of the memory cell array or weak address of weak cells of the memory cell array, and the self fail address information FA_INFO may be transmitted from the second fail address table 237 to the first fail address table 321 in FIG. 4 through data I/O buffer 295 and the data pin during power-up sequence or reset period of the memory device 201.

FIG. 14 illustrates one bank memory array and one bank column decoder in FIG. 13.

Referring to FIG. 14, the bank column decoder 270a is connected to the bank memory array 280a.

The bank memory array 280a includes a plurality of memory cells NC and a plurality of redundant cells RC. Each of the memory cells MC is formed at an intersection point of each of word-lines WL1~WLn and each of bit-lines (or column select lines CSL1, CSL2, etc.). Each of the redundant cells RC is formed at an intersection point of each of word-lines WL1~WLn and each of at least one bit-line or at least one spare column select line ERCSL that is externally accessible. A reference numeral 281 denotes a defective cell (or fail cell) and a reference numeral 283 denotes a normal cell of the memory cells MC. The bank column decoder 270a receives column address signals CA0~CA12 and a spare column address signal CA13, and operates in one mode of a normal column access mode and a redundancy column access mode based on a logic level of the spare column address signal CA13. The spare column address signal CA13 may be provided from the fail address processing unit 321 of FIG. 12. When the access address ADD matches with one of the fail addresses stored in the first fail address table 3211, the fail address processing unit 321 may provide the bank column decoder 270a with the spare column address signal CA13 having a high level. The bank column decoder 270a disables a column line connected to the fail cells and enables the spare column line ERSCL in response to the spare column address signal CA13 having a high level. Then the bank column decoder 270a may repair the distributed fail cells A and B in some memory cell rows with the redundancy cells A' and B' by enabling the spare column line ERSCL. Although, the bank memory array 280a includes one spare column line in FIG. 14, a bank memory array may include two or more spare column lines.

In addition, some of the errors exceeding error correction capability of the ECC unit 319 in FIG. 4 may be corrected using the spare column line, and remaining errors may be corrected in the ECC unit 319 in FIG. 4 by using parity bits. In addition, the ECC unit 319 may correct additional errors of another memory cell row in addition to the memory cell row corresponding to the fail address by using the spare column line.

Figure 15:
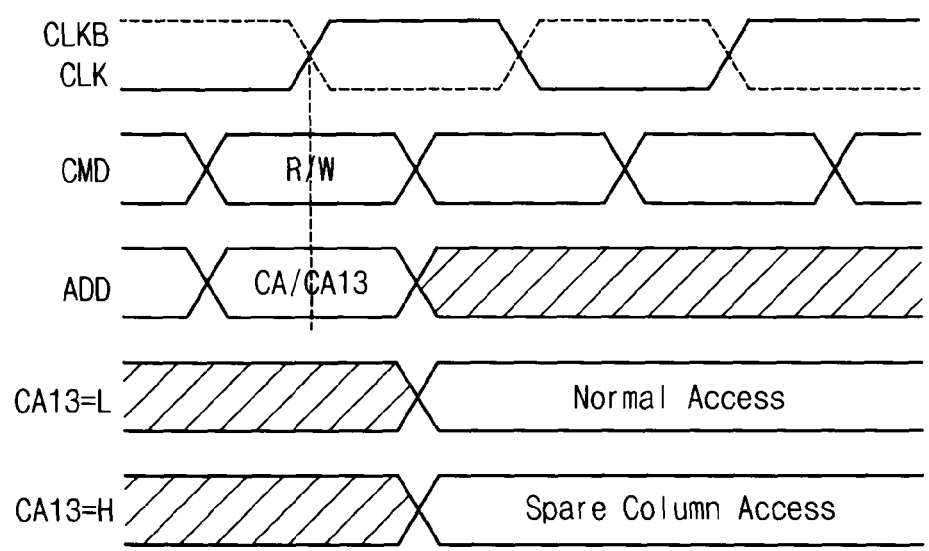
FIG. 15 is a timing diagram illustrating operation mode of the column decoder in FIG. 14.

FIG. 15 is a timing diagram illustrating operation mode of the column decoder in FIG. 14.

Referring to FIG. 15, when the spare column address signal CA13 has a low level, normal access is performed on the normal columns and when the spare column address signal CA13 has a high level, the spare column access is performed on the spare column line ERSCL.

Figure 16:
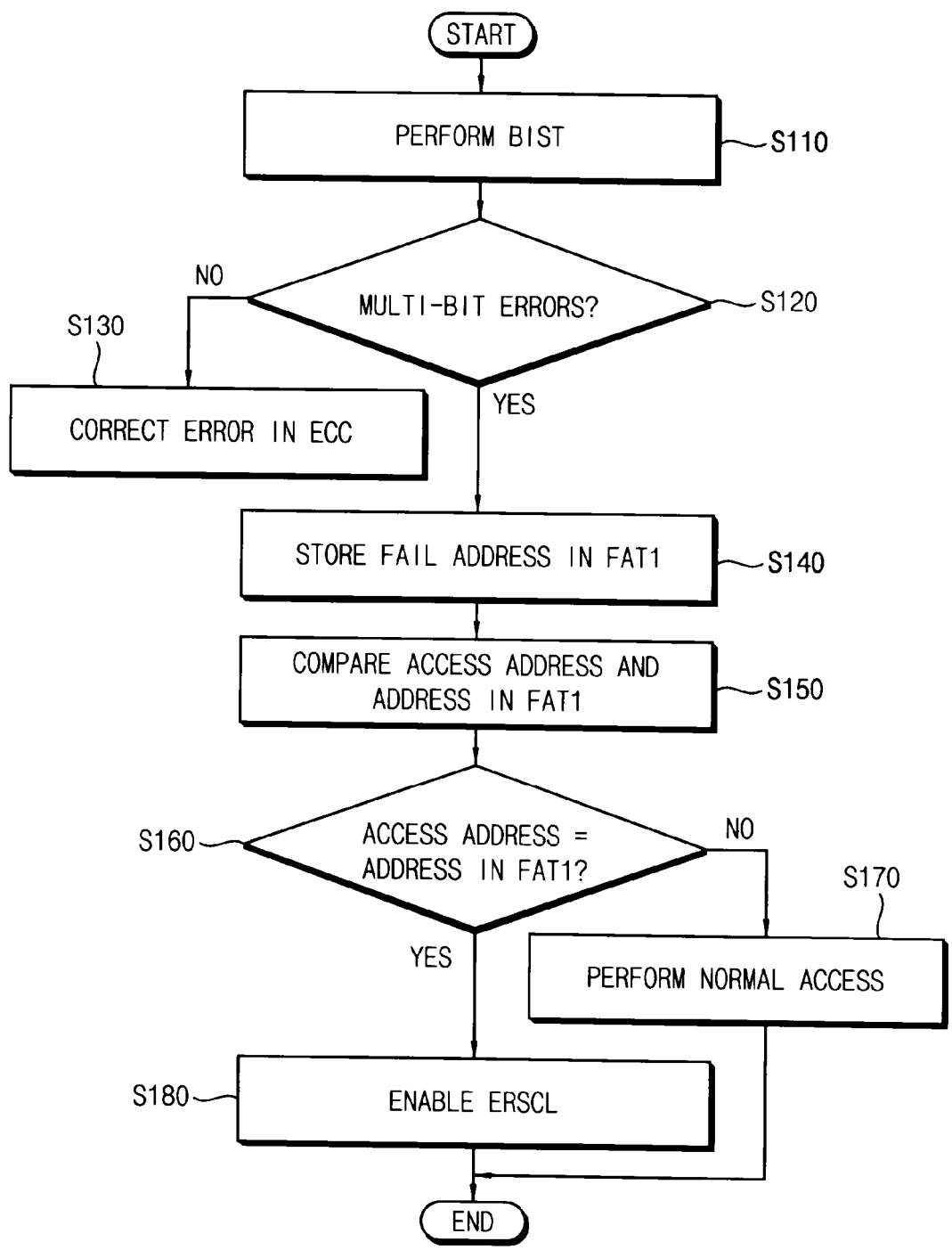
FIG. 16 is a flow chart illustrating a method of correcting errors in the memory module according to example embodiments.

FIG. 16 is a flow chart illustrating a method of correcting errors in the memory module according to example embodiments.

Referring to FIGS. 4, 7, 14 and 16, BIST is performed on the memory cell array in the memory BIST unit 3140 of the scrubber 314 (S110). It is determined whether the memory cell array includes uncorrectable errors (multi-bit errors) based on the result of the BIST in the error detection unit 3145 (S120). When the memory cell array includes errors correctable by the ECC unit 3145 (NO in S120), the errors are corrected in the ECC unit 3145 (S130). When the memory cell array includes errors uncorrectable by the ECC unit 3145 (YES in S120), address of a page including the multi-bit errors are stored as the fail address in the first address table 3211 (S140). The access address ADD is compared with the fail addresses stored in the first fail address table 3211 (S150), it is determined whether the access address ADD matches with one of the fail addresses (S160). When the access address ADD does not match any of the fail addresses (NO in S160), normal column is accessed in the bank column decoder 270a (S170). When the access address ADD matches one of the fail addresses (YES in S160), the bank column decoder 270a disables a column line connected to the fail cells and enables the spare column line ERSCL to replace the fail cells with redundancy cells (S180).

As mentioned above, the self fail address information including the fail addresses of each memory device may be transmitted from the second fail address table 237 to the first fail address table 3211.

Figure 17:
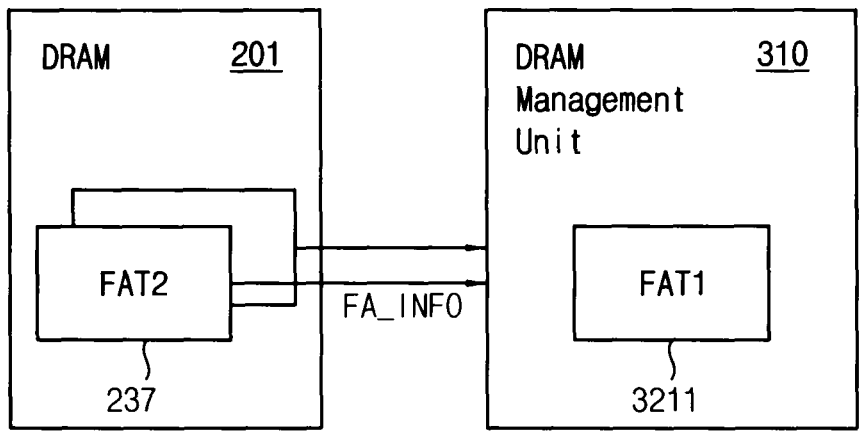
FIG. 17 illustrates a relationship between the first fail address table and the second fail address table.

FIG. 17 illustrates a relationship between the first fail address table and the second fail address table.

Referring to FIG. 17, the memory device 201 may include the second fail address table 237 and the fail address processing unit 321 in the memory management unit 310 may include the first fail address table 3211. The fail addresses (self fail addresses) stored in the second fail address table 237 may be transmitted to the first fail address table 3211 through data pin of the memory device 210 during power-up sequence or reset period of the memory module 100 and stored in the first fail address table 3211.

Figure 18:
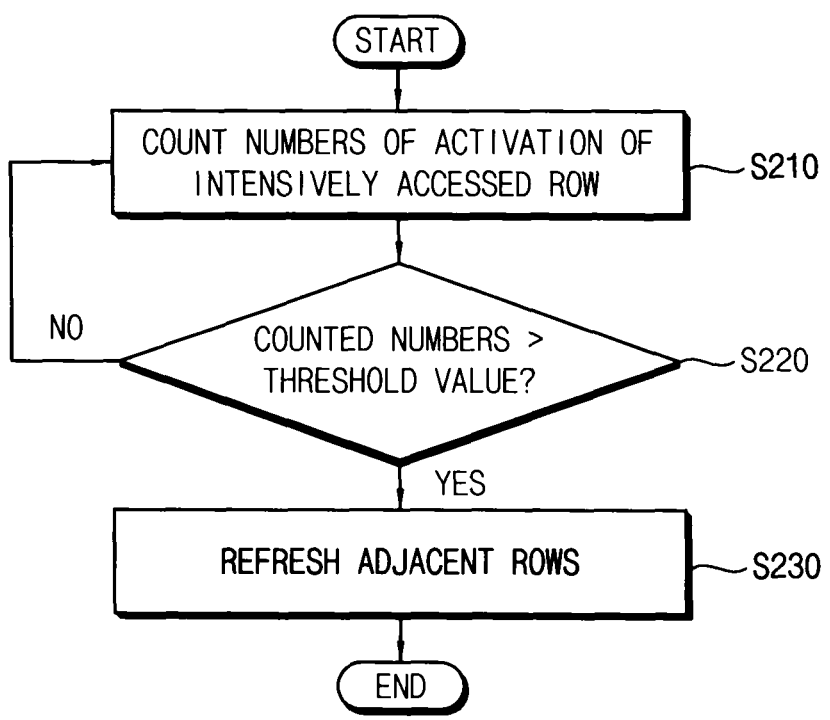
FIG. 18 is a flow chart illustrating a method of refreshing neighboring memory cells according to example embodiments.

FIG. 18 is a flow chart illustrating a method of refreshing neighboring memory cells according to example embodiments.

Referring to FIGS. 4, 10, 11 and 18, the row address activation counting unit 322 counts activation frequency of an intensively accessed memory cell row (S210). It is determined whether the counting value of the activation frequency of the intensively accessed memory cell row exceeds a desired (or, alternatively predetermined) threshold value during a desired (or, alternatively predetermined) time interval (S220). When the counting value does not exceed the threshold value (NO in S220), the method returns to the step (S210). When the counting value exceeds the threshold value (YES in S220), the intensively accessed row address ADD_F is notified of the refresh scheduler 312, and the refresh scheduler 312 preferentially refreshes the neighboring memory cell rows adjacent to the intensive accessed memory cell row corresponding to the row address ADD_F (S230). The refresh scheduler 312 receives the intensively accessed row address ADD_F and performs ROR by adjusting some bits of the intensively accessed row address ADD_F and providing the refresh address ADD_REF of the neighboring memory cell rows to the memory device.

Figure 19:
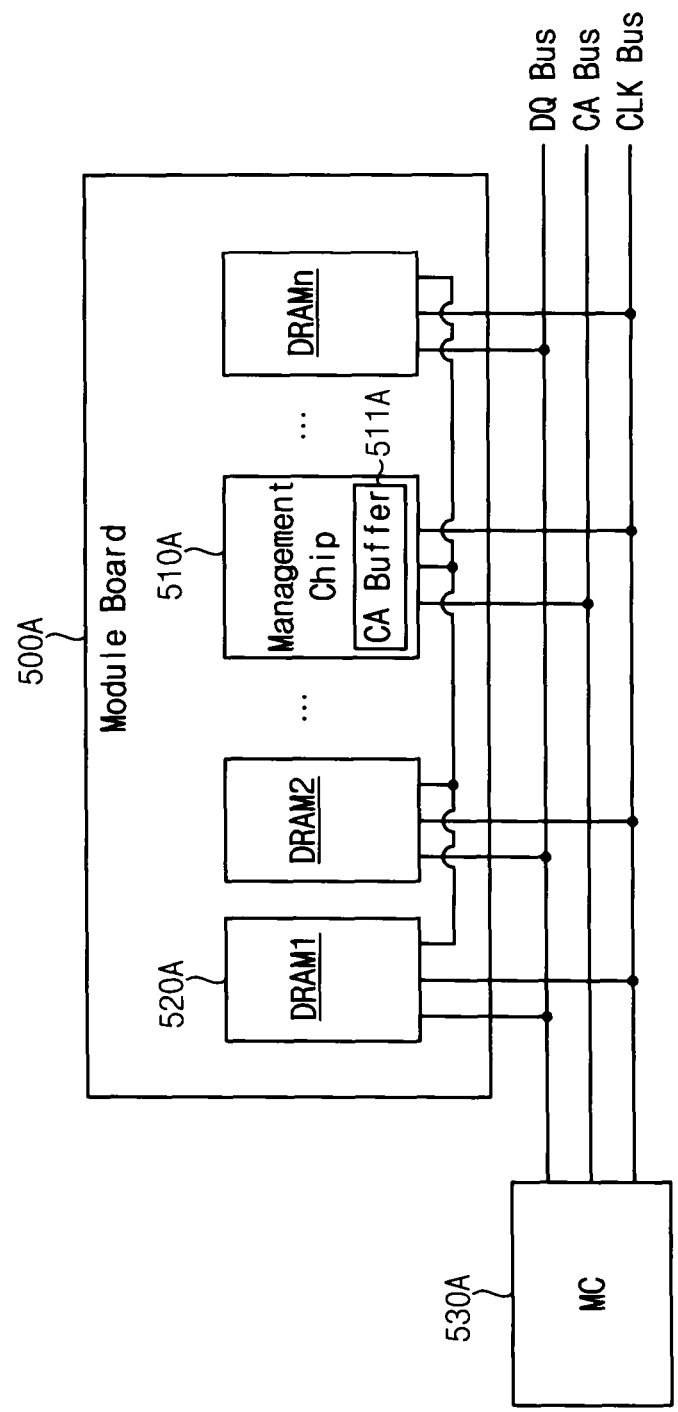
FIG. 19 is a block diagram illustrating a memory module according to example embodiments.

FIG. 19 is a block diagram illustrating a memory module according to example embodiments.

In the previous example embodiment, various policies including the refresh operation are applied to the FBDIMM; in the following example embodiment, they are applied to a registered dual in-line memory module (RDIMM).

Referring to FIG. 19, a memory module 500A may include a DRAM management chip 510A and one or more devices 520A mounted on a module board. As the device 520A, a DRAM including DRAM cells may be used. In FIG. 19, a memory controller 530A is further illustrated, such that the memory controller 530A and the memory module 500A may form a memory system. The memory controller 530A and the memory module 500A communicate through various system buses, for example, a data bus DQ Bus, a command/address bus CA Bus, and a clock bus CLK Bus. Data and a clock signal from the memory controller 530A are provided to the devices 520A through the system bus and buses arranged separately for the respective devices 520A. Command/address signals are first provided to the memory management chip 510A, and the memory management chip 510A then buffers the command/address signals and provides them to the respective devices 520A.

The DRAM management chip 510A may include various functional blocks provided in the above-described example embodiments. For example, the DRAM management chip 510A may include a meta data storing unit for storing memory device operational parameter values configured to affect the operations of the devices 520A, for example, on a region-by-region basis. The DRAM management chip 510A may include various functional blocks such as a refresh scheduler, an LRU/FIFO unit, a scrubber, a fail address table, a row address active counting logic, etc., to manage the refresh operation with respect to the memory cell array.

The DRAM management chip 510A includes a command/address buffer 511A for storing command/address signals transmitted through the system bus, e.g., the command/address bus CA Bus. The command/address signals from the command/address buffer 511A are provided to the devices 520A, or the command/address signals may be processed in the DRAM management chip 510A and the processed command/address signals are provided to the devices 520A. For example, the DRAM management chip 510A buffers external command/address signals for the read/write operations and provides them to the semiconductor devices 5200A, or generates the command CMD_Ref and the address ADD_Ref related to the refresh operation and provides them to the devices 520A. The command/address signals are provided to the devices 520A through an internal bus CABUS_I disposed on the module board.

Figure 20:
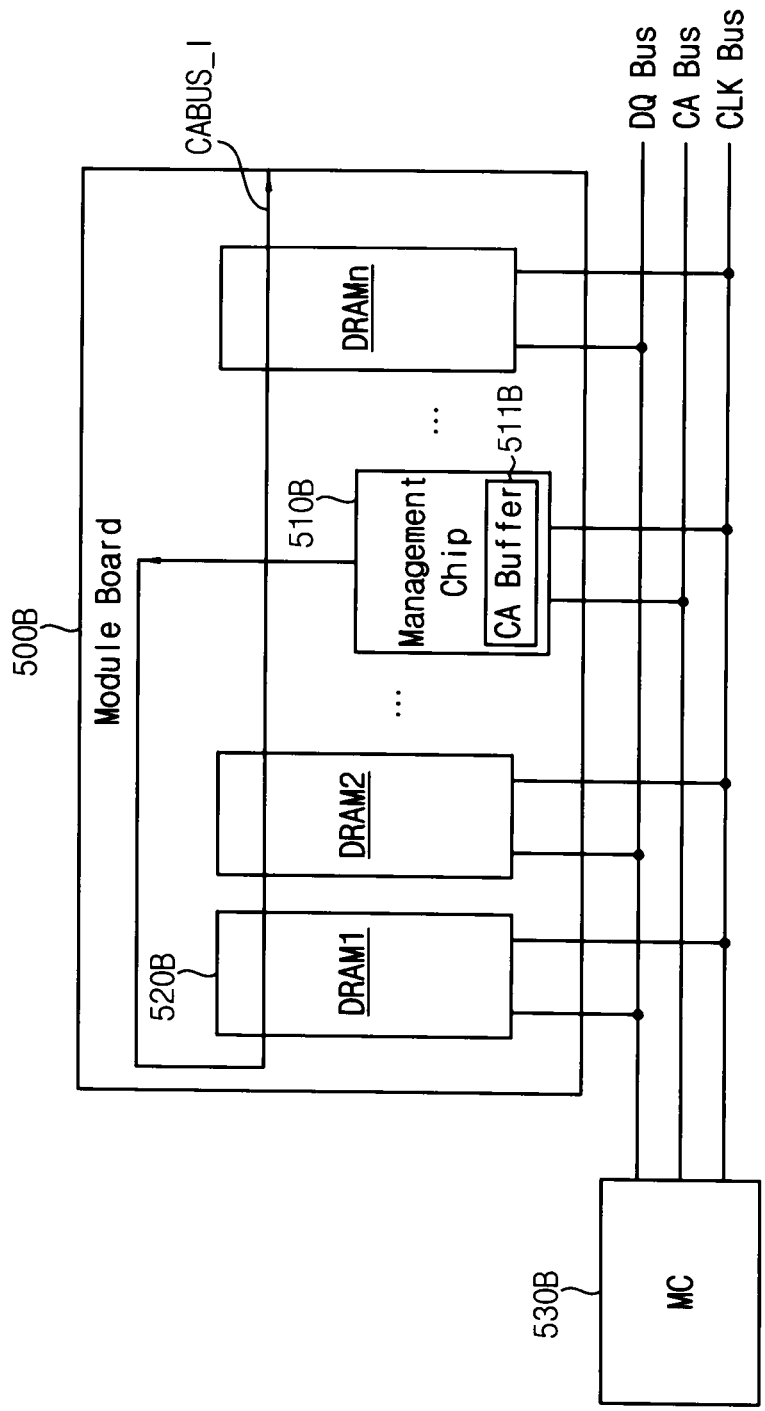
FIG. 20 is a block diagram illustrating a memory module according to example embodiments.

FIG. 20 is a block diagram illustrating a memory module according to example embodiments.

The memory module 500B in FIG. 20 also includes a DRAM management chip 510B and one or more devices 520B mounted on a module board. The memory module 500B communicates with a memory controller 530B through system buses DQ Bus, CA Bus, and CLK Bus. The DRAM management chip 510B may include various functional blocks provided in the foregoing example embodiments, and include a command/address buffer 5110B for storing command/address signals transmitted through the system bus.

FIG. 20 illustrates the memory module 500B using the internal bus CABUS_I in a fly-by daisy chain form, such that the internal bus CABUS_I forwards internal command/address signals from a side to another side of the memory module 500B. For example, the refresh command CMD_Ref and the refresh address ADD_Ref generated in the DRAM management chip 510B are sequentially forwarded from a first device DRAM 1 to an nth device DRAMn.

Figure 21:
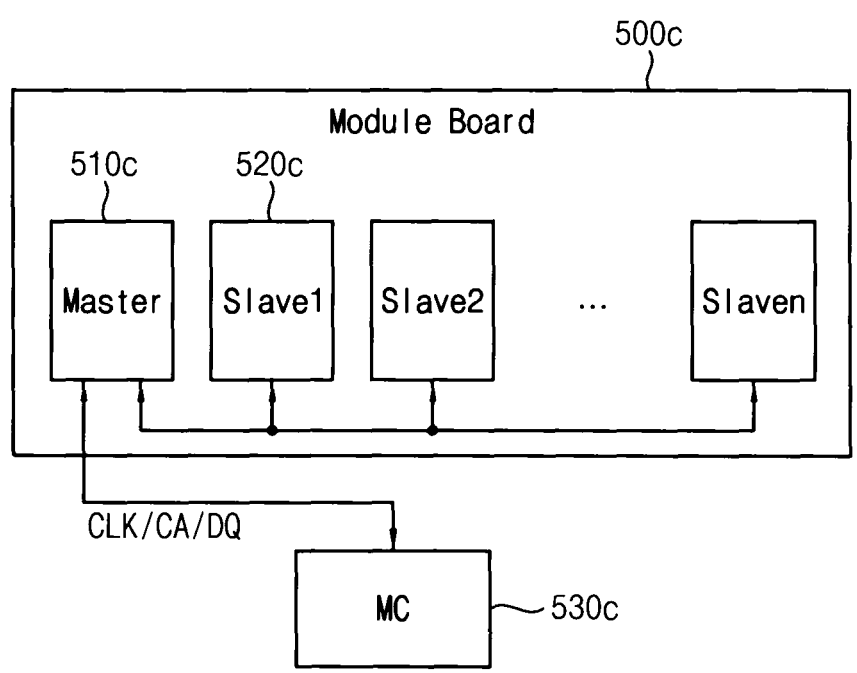
FIG. 21 is a block diagram illustrating a memory module according to example embodiments.

FIG. 21 is a block diagram illustrating a memory module according to example embodiments.

The memory module 500C in FIG. 21 may include a master chip 510C and one or more slave chips 520C mounted on a module board. For example, one master chip 510C and n slave chips 520C are mounted on the module board, as illustrated in FIG. 21.

The master chip 510C communicates with an external memory controller 530C, and transmits and receives a clock signal CLK, command/address signals CA, and data DQ through a system bus. The master chip 510C may include an interface circuit (not illustrated) for interfacing with the memory controller 530C, forwards a signal provided from the memory controller 530C to the slave chips 520C through the interface circuit, and forwards a signal provided from the slave chips 520C to the memory controller 530C. Each slave chip 520C may include a memory cell array, for example, a memory cell array including DRAM cells. In addition to the interface circuit, the master chip 510C may further include a DRAM management unit for managing the slave chips 520C. The DRAM management chip may include various functional blocks provided in the above-described example embodiments. For example, the DRAM management chip may include a meta data storing unit for storing memory device operational parameter values configured to affect the operations of the devices 520A, for example, on a region-by-region basis. The DRAM management chip may include various functional blocks such as a refresh scheduler, an LRU/FIFO unit, a scrubber, a fail address table, a row address active counting logic, etc., to manage the refresh operation with respect to the memory cell array. The operation of the DRAM management unit related to various policies is the same as or similar to the description made in the previous example embodiments, and thus will not be described in detail.

Figure 22:
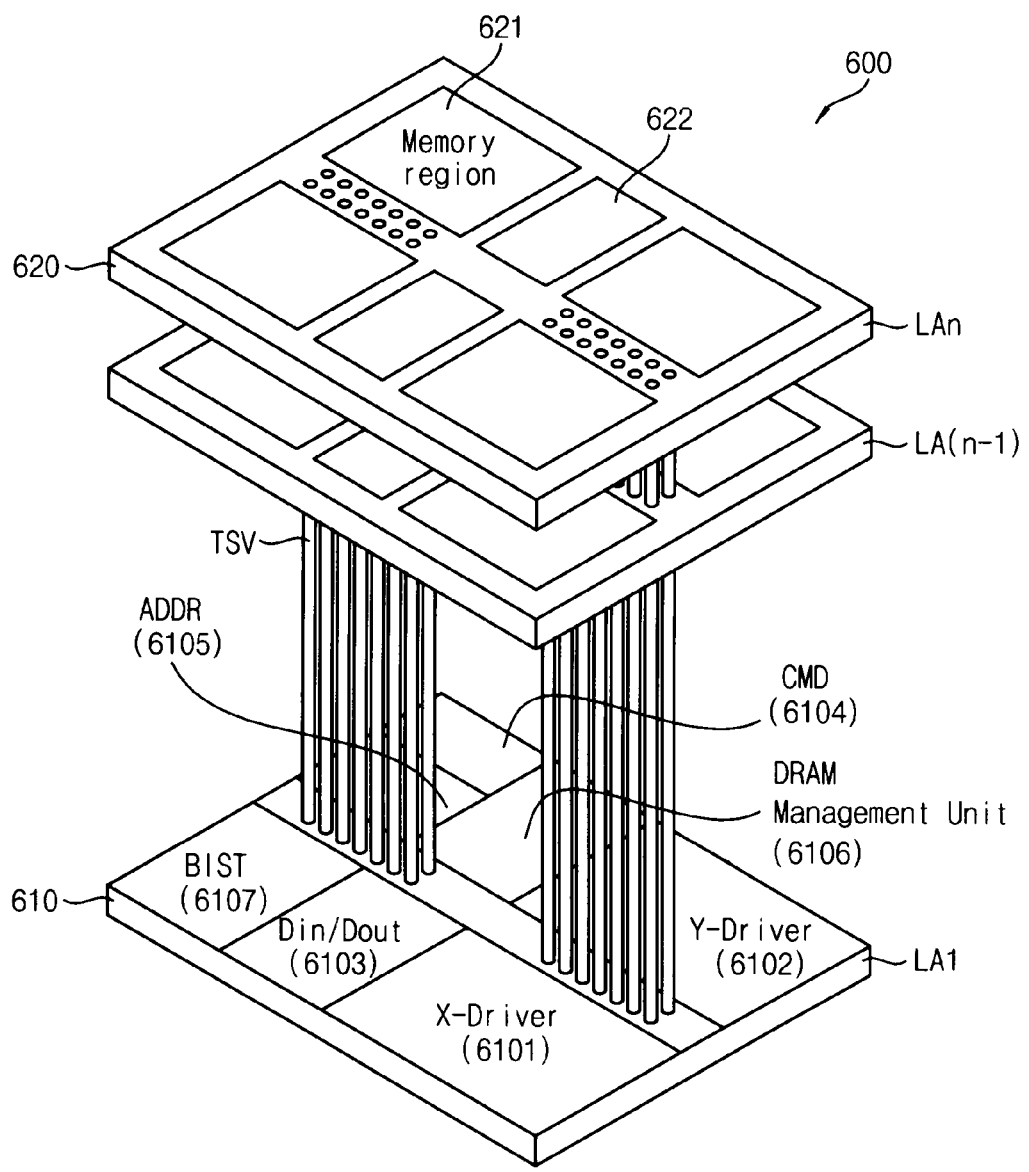
FIG. 22 is a structural diagram illustrating a semiconductor device according to example embodiments.

FIG. 22 is a structural diagram illustrating a semiconductor device according to example embodiments.

Referring to FIG. 22, a semiconductor device 600 may include a plurality of first through nth semiconductor integrated circuit layers LA1 through LAn, in which the lowest first semiconductor integrated circuit layer LA1 is assumed to be an interface or control chip and the other semiconductor integrated circuit layers LA2 through LAn are assumed to be slave chips, including core memory chips. The plurality of semiconductor integrated circuit layers LA1 through LAn transmit and receive signals there between through through-silicon-vias (TSVs). The lowest first semiconductor integrated circuit layer LA1 as the interface or control chip communicates with an external memory controller through a conductive structure formed on an external surface. A description will be made regarding the structure and operation of the semiconductor device 600 by mainly using the first semiconductor integrated circuit layer LA1 or 610 as the interface or control chip and the nth semiconductor integrated circuit layer LAn or 620 as the slave chip.

The first semiconductor integrated circuit layer 610 may include various peripheral circuits for driving memory regions 621 provided in the nth semiconductor integrated circuit layer 620. For example, the first semiconductor integrated circuit layer 610 may include a row (X)-driver 6101 for driving word lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address.

The first semiconductor integrated circuit layer 610 may further include a DRAM management unit 6106 for managing the memory regions 621 provided in the nth semiconductor integrated circuit layer 620. The DRAM management unit 6106 may include a memory device operational parameter storage circuit for storing memory device operational parameter values related to memory cell arrays, a refresh scheduler for managing the refresh operation, a fail address table, and functional blocks related to various policies for the memory described above in the previous example embodiments. The first semiconductor integrated circuit layer 610 may further include a BIST unit 6107 for testing a function of the semiconductor device 600 in a built-in form. A feature of the memory cell array is discriminated according to the test result provided by the BIST unit 6107, and fail addresses corresponding to the discrimination result may be stored in the fail address table. According to the operation of the BIST unit 6107, the fail addresses may be stored during initial driving of the semiconductor device 600 (e.g., during the power-up operation), or the semiconductor device 600 may be periodically tested and the fail addresses may be periodically updated according to the test result. Inclusion of the BIST unit 6107 in the semiconductor device 600 and operations of storing and updating memory device operational parameter value according to the test of the BIST unit 6107 may be applied to in the same or similar way also in the above-described example embodiments of the memory modules.

The nth semiconductor integrated circuit layer 620 may include the memory regions 621 including memory cell arrays and peripheral circuit regions 622 in which peripheral circuits for reading/writing data of the memory regions 621, e.g., a row decoder, a column decoder, a bit line sense amplifier, etc. (not illustrated) are arranged.

In FIG. 22, unlike some of the example embodiments described above, data driving operations (the read, write, and refresh operations, etc.) and management operations according to various policies related to the data driving operations may be integrated in a single semiconductor device. The semiconductor device 600 may be a three-dimensional memory device including the plurality of semiconductor integrated circuit layers LA1 through LAn, which include an interface or control chip and slave chips. The DRAM management unit 6106 is arranged in the first semiconductor integrated circuit layer 610 as the interface or control chip. The command signal stored in the command buffer 6104 and the address signal stored in the address buffer 6105 are provided to the DRAM management unit 6106, which then performs various operations for managing the memory regions 621 by referring to values stored in various fields of a memory device operational parameter storage circuit (not illustrated) provided in the DRAM management unit 6106. The DRAM management unit 6106 generates a refresh command and a refresh address for controlling the refresh operation with respect to the memory regions 621, and the generated refresh command and refresh address are provided to slave chips through the TSVs.

Figure 23:
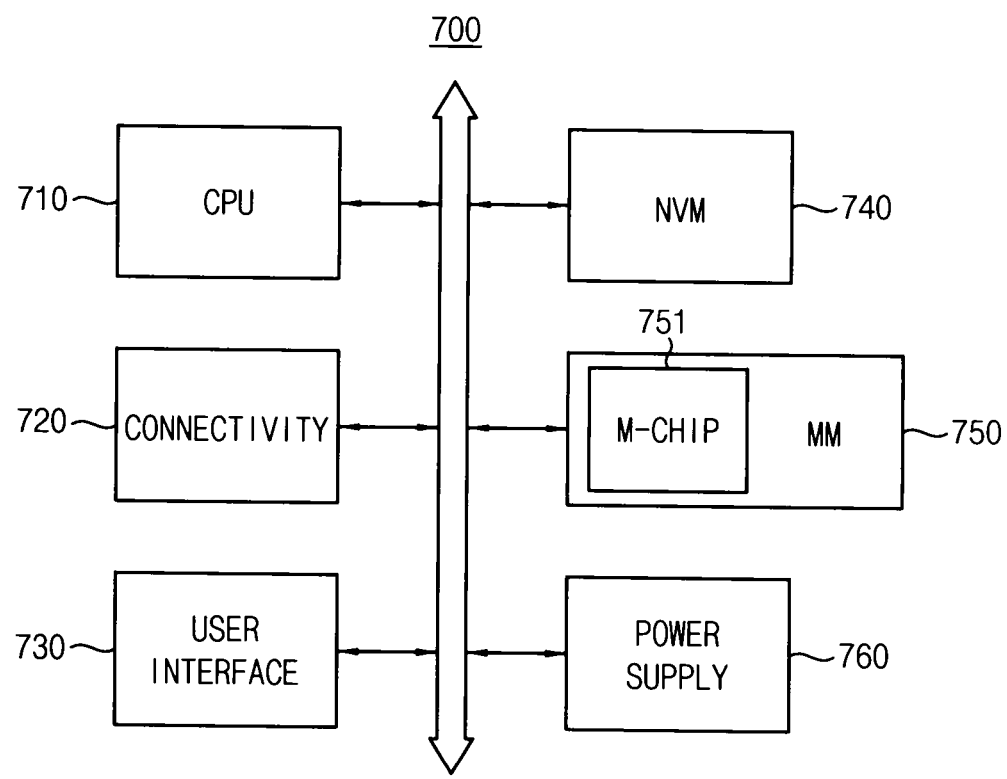
FIG. 23 is a block diagram illustrating a mobile system including the memory module according to example embodiments.

FIG. 23 is a block diagram illustrating a mobile system including the memory module according to example embodiments.

Referring to FIG. 23, a mobile system 700 includes a central processing unit (CPU) 710 such as an application processor, a connectivity unit 720, a memory module 750, a nonvolatile memory device 740, a user interface 730 and a power supply 760. In some example embodiments, the mobile system 700 may be a mobile phone, a smart phone, a personal digital assistant (PDA), a portable multimedia player (PMP), a digital camera, a music player, a portable game console, a navigation system, etc.

The CPU 710 may execute applications, such as a web browser, a game application, a video player, etc. In some example embodiments, the application processor 710 may include a single core or multiple cores. For example, the CPU 710 may be a multi-core processor, such as a dual-core processor, a quad-core processor, a hexa-core processor, etc. The CPU 710 may include an internal or external cache memory.

The connectivity unit 720 may perform wired or wireless communication with an external device. For example, the connectivity unit 720 may perform Ethernet communication, near field communication (NFC), radio frequency identification (RFID) communication, mobile telecommunication, memory card communication, universal serial bus (USB) communication, etc. In some example embodiments, connectivity unit 720 may include a baseband chipset that supports communications, such as global system for mobile communications (GSM), general packet radio service (GPRS), wideband code division multiple access (WCDMA), high speed downlink/uplink packet access (HSxPA), etc.

The memory module 750 may store data processed by the CPU 710, or may operate as a working memory. For example, the memory module 750 may include a plurality of memory devices and a buffer chip. The buffer chip may employ the buffer chip 300 in FIG. 3 and includes the memory management unit 310 in FIG. 4. The buffer chip manages operation of the memory devices.

The nonvolatile memory device 740 may store a boot image for booting the mobile system 700. For example, the nonvolatile memory device 740 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 730 may include at least one input device, such as a keypad, a touch screen, etc., and at least one output device, such as a speaker, a display device, etc. The power supply 760 may supply a power supply voltage to the mobile system 700. In some example embodiments, the mobile system 700 may further include a camera image processor (CIS), and/or a storage device, such as a memory card, a solid state drive (SSD), a hard disk drive (HDD), a CD-ROM, etc.

In some example embodiments, the mobile system 700 and/or components of the mobile system 1100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 24:
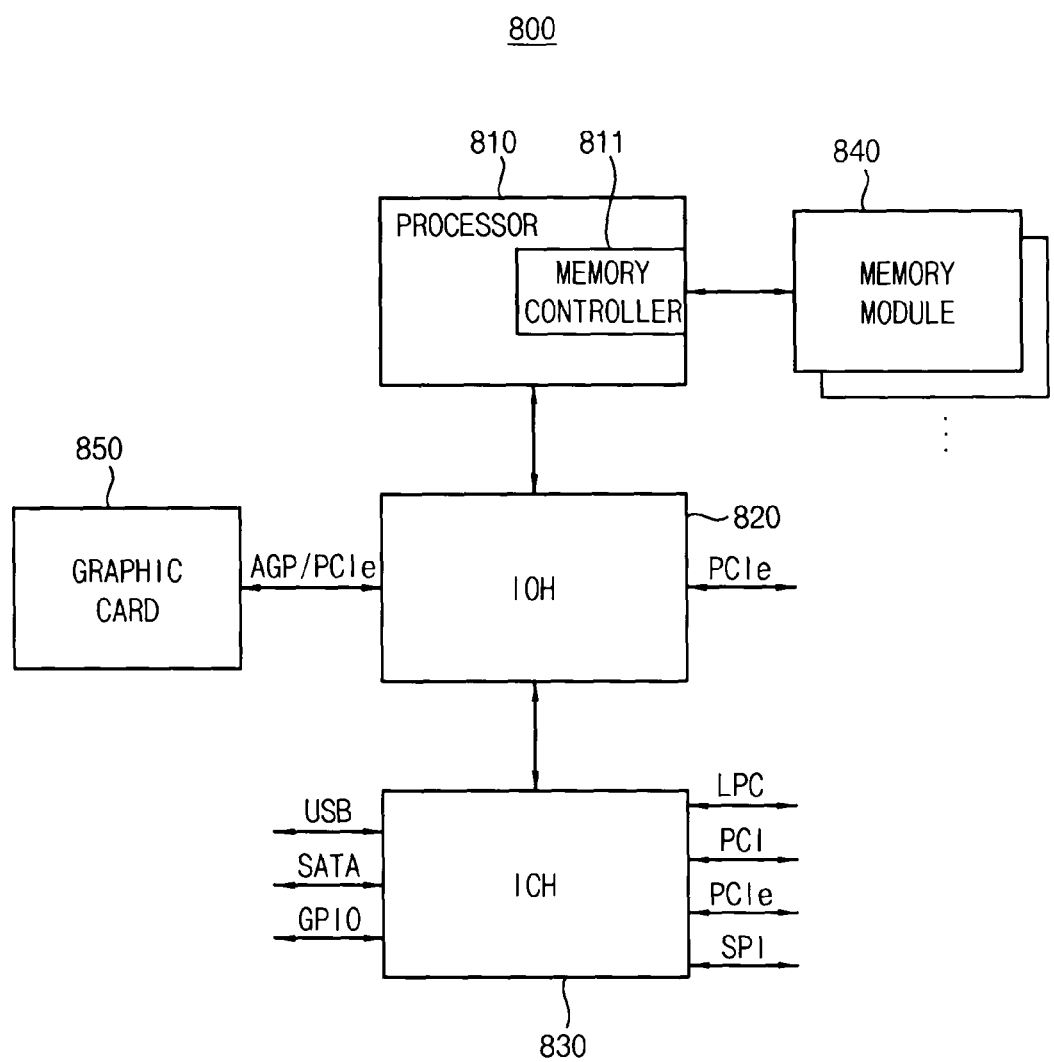
FIG. 24 is a block diagram illustrating a computing system including the memory module according to example embodiments.

FIG. 24 is a block diagram illustrating a computing system including the memory module according to example embodiments.

Referring to FIG. 24, a computing system 800 includes a processor 810, an input/output hub (IOH) 820, an input/output controller hub (ICH) 830, at least one memory module 840 and a graphics card 850. In some example embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some example embodiments, the processor 810 may include a single core or multiple cores. For example, the processor 810 may be a multi-core processor, such as a dual-core processor, a quad-core processor, a hexa-core processor, etc. Although FIG. 21 illustrates the computing system 800 including one processor 810, in some example embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some example embodiments, the memory controller 811 may be located inside the input/output hub 820, which may be referred to as memory controller hub (MCH).

The memory module 840 may include a plurality of memory devices that store data provided from the memory controller 811 and a buffer chip that manages overall operation of the memory devices. The buffer chip may employ the buffer chip 300 in FIG. 3 and includes the memory management unit 310 in FIG. 4. Each of the memory devices may store data processed by the CPU 710, or may operate as a working memory. Each of the memory devices may be a dynamic random access memory, such as DDR SDRAM, LPDDR SDRAM, GDDR SDRAM, RDRAM, etc. The buffer chip manages operation of the memory devices.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. Although FIG. 21 illustrates the computing system 800 including one input/output hub 820, in some example embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not illustrated) for displaying an image. The graphics card 850 may include an internal processor for processing image data and an internal memory device. In some example embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some example embodiments, the processor 810, the input/output hub 820 and the input/output controller hub 830 may be implemented as separate chipsets or separate integrated circuits. In other example embodiments, at least two of the processor 810, the input/output hub 820 and the input/output controller hub 830 may be implemented as a single chipset.

As mentioned above, the memory module includes a buffer chip that repairs fail cells by enabling spare column lines that are externally accessible when the fail address is accessed and that preferentially refreshes neighboring memory cell rows adjacent to an intensively accessed memory cell row. Therefore, performance of the memory module may be enhanced while reducing occupied area.

Example embodiments of the inventive concepts may be applied to high-density memory modules.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory module, comprising:
a plurality of memory devices; and
a buffer chip configured to manage the plurality of memory devices, the buffer chip including a memory management unit having an error correction unit configured to perform an error correction operation on each of the plurality of memory devices, wherein
each of the plurality of memory devices includes at least one spare column accessible by the memory management unit,
the memory management unit is configured to correct errors of the plurality of memory devices by selectively using the at least one spare column based on an error correction capability of the error correction unit, and
the memory management unit further includes a first fail address table configured to store fail address information corresponding to an address of at least one memory cell row of at least one of the plurality of memory devices, the at least one memory cell row including at least one defective cell.

2. The memory module of claim 1, wherein the memory management unit further comprises:
a fail address processing unit configured to activate a spare column address signal that replaces a column corresponding to an access address with the at least one spare column, when the access address matches the address, the fail address information of which is stored in the first fail address table.

3. The memory module of claim 2, wherein the fail address processing unit comprises:
the first fail address table; and
an address comparing unit configured to,
compare the access address with the fail address information; and
selectively activate the spare column address signal based on the comparing of the access address with the fail address information.

4. The memory module of claim 1, wherein the memory management unit corrects an error by enabling the at least one spare column when at least one of the plurality of memory devices has an error that occurs at a first memory cell row, the first memory cell row being different from a second memory cell row associated with the fail address information.

5. The memory module of claim 1, wherein the memory management unit corrects a first error by enabling the at least one spare column, and
the error correction unit corrects at least one second error without correcting the first error when at least one of the plurality of memory devices has errors including the first error and the at least one second error, the at least one second error being non-correctable by the memory management unit.

6. The memory module of claim 1, wherein the memory management unit further comprises a scrubber configured to perform a built-in self test (BIST) on each of the plurality of memory devices, and
the fail address information is transmitted from the scrubber to the first fail address table.

7. The memory module of claim 1, wherein each of the plurality of memory devices comprises a second fail address table configured to store self fail address information.

8. The memory module of claim 7, wherein the self fail address information is transmitted from the second fail address table to the first fail address table and is stored as the fail address information.

9. The memory module of claim 8, wherein the self fail address information is transmitted from the second fail address table to the first fail address table through a data pin of each of the plurality of memory devices during at least one of a power-up sequence and a reset period of the memory module.

10. The memory module of claim 1, wherein the memory management unit further comprises:
a row address activation counting unit configured to output an intensively accessed address designating a intensively accessed memory cell row based on an access frequency of memory cell rows of each of the plurality of memory devices, the intensively accessed memory cell row being accessed more than a threshold value during a time interval; and
a refresh scheduler configured to receive the intensively accessed address and configured to preferentially refresh neighboring memory cell rows adjacent to the intensively accessed memory cell row.

11. The memory module of claim 10, wherein the time interval corresponds to a refresh period of each of the plurality of memory devices.

12. The memory module of claim 10, wherein the refresh operation on the neighboring memory cell rows is a Row Address Strobe (RAS) only refresh (ROR), and
the refresh scheduler performs the ROR by providing the corresponding one of the plurality of memory devices with refresh row addresses corresponding to the neighboring memory cell rows.

13. A memory system comprising:
a memory controller; and
a memory module configured to communicate with the memory controller to perform memory operation, wherein the memory module includes,
a plurality of memory devices, and
a buffer chip configured to manage the plurality of memory devices, the buffer chip including a memory management unit having an error correction unit configured to perform an error correction operation on each of the plurality of memory devices, wherein
each of the plurality of memory devices includes at least one spare column accessible by the memory management unit,
the memory management unit is configured to correct errors of the plurality of memory devices by selectively using the at least one spare column based on an error correction capability of the error correction unit, and
the memory management unit further includes a first fail address table configured to store fail address information corresponding to an address of at least one memory cell row of at least one of the plurality of memory devices, the at least one memory cell row including at least one defective cell.

14. The memory system of claim 13, wherein the memory management unit further includes:
a fail address processing unit configured to activate a spare column address signal that replaces a column corresponding to an access address with the at least one spare column, when the access address matches the address, the fail address information of which is stored in the first fail address table, wherein each of the plurality of memory devices includes a second fail address table configured to store self fail address information, and the self fail address information is transmitted from the second fail address table to the first fail address table and is stored as the fail address information.

15. A memory module, comprising:
a plurality of memory devices, each of the plurality of memory devices including at least one spare column;
a memory management unit configured to correct errors of the plurality of memory devices by selectively using the at least one spare column;
a scrubber unit configured to detect at least one bit error in each of the plurality of memory devices; and
a fail address unit configured to store fail address information corresponding to one of the plurality of memory devices in which the scrubber unit detects at least one multi-bit error.

16. The memory module of claim 15, wherein the memory management unit is configured to selectively use the at least one spare column based on an error correction capability of the memory management unit.

17. The memory module of claim 15, wherein the memory management unit is further configured to selectively use the at least one spare column by,
activating the corresponding one of at least one spare column based on the fail address information corresponding to an access address for accessing at least one of the plurality of memory devices.

18. The memory module of claim 15, wherein the memory management unit further comprises:
a row address activation counting unit configured to output at least one intensively accessed address designating at least one intensively accessed memory cell row of at least one of the plurality of memory devices, the at least one intensively accessed memory cell row being accessed more than a threshold number of times during a time interval; and
a refresh scheduler configured to refresh neighboring memory cell rows adjacent to the at least one intensively accessed memory cell row.

* * * * *